US012538517B2

(12) United States Patent
Lee et al.

(10) Patent No.: US 12,538,517 B2
(45) Date of Patent: Jan. 27, 2026

(54) SEMICONDUCTOR DEVICE

(71) Applicant: Samsung Electronics Co., Ltd., Suwon-si (KR)

(72) Inventors: Sanggil Lee, Ansan-si (KR); Seokhoon Kim, Suwon-si (KR); Sungmin Kim, Incheon (KR); Jungtaek Kim, Yongin-si (KR); Pankwi Park, Incheon (KR); Dongsuk Shin, Suwon-si (KR); Namkyu Cho, Yongin-si (KR); Ryong Ha, Seoul (KR); Yang Xu, Suwon-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 639 days.

(21) Appl. No.: 17/843,970

(22) Filed: Jun. 18, 2022

(65) Prior Publication Data

US 2023/0163213 A1    May 25, 2023

(30) Foreign Application Priority Data

Nov. 19, 2021   (KR) .................. 10-2021-0160367

(51) Int. Cl.
*H10D 30/62* (2025.01)
*H10D 30/69* (2025.01)
(Continued)

(52) U.S. Cl.
CPC ......... *H10D 30/62* (2025.01); *H10D 30/6219* (2025.01); *H10D 30/797* (2025.01);
(Continued)

(58) Field of Classification Search
CPC ...... H10D 30/62; H10D 30/014; H10D 30/43; H10D 30/6219; H10D 30/6735; H10D 30/6757; H10D 30/797; H10D 62/121; H10D 62/822; H10D 64/017; H10D 64/311; H10D 64/66; H10D 84/0167; H10D 84/017; H10D 84/038; H10D 84/85; H10D 84/853; H10D 62/832; H10D 30/751; H10D 62/151; H10D 62/364; H10D 64/256;
(Continued)

(56) References Cited

U.S. PATENT DOCUMENTS 9,142,676 B2    9/2015  Ching et al.
9,159,833 B2   10/2015  Ching et al.
(Continued)

*Primary Examiner* — Eduardo A Rodela
(74) *Attorney, Agent, or Firm* — Muir Patent Law, PLLC

(57) ABSTRACT

Disclosed is a semiconductor device comprising a substrate including first and second PMOSFET regions, first and second active patterns on the first and second PMOSFET regions, first and second channel patterns on the first and second active patterns and each including semiconductor patterns, and first and second source/drain patterns connected to the first and second channel patterns. The first active pattern includes a first lower semiconductor layer, a first middle semiconductor layer, and a first upper semiconductor layer. Each of the first and second lower semiconductor layers includes silicon. The first middle semiconductor layer includes silicon-germanium. The first middle semiconductor layer has a width that decreases in a downward direction to a maximum value and then increases in the downward direction.

20 Claims, 31 Drawing Sheets

(51) Int. Cl.
*H10D 62/822* (2025.01)
*H10D 64/27* (2025.01)
*H10D 64/66* (2025.01)
*H10D 84/03* (2025.01)
*H10D 84/85* (2025.01)

(52) U.S. Cl.
CPC ......... *H10D 62/822* (2025.01); *H10D 64/311* (2025.01); *H10D 64/66* (2025.01); *H10D 84/038* (2025.01); *H10D 84/85* (2025.01); *H10D 84/853* (2025.01)

(58) Field of Classification Search
CPC ........... H10D 84/0184; H10D 84/0128; H10D 84/83; H10D 84/856; H10D 62/85; H10D 30/019; H10D 30/0191; H10D 30/0193; H10D 30/0194; H10D 30/0195; H10D 30/0196; H10D 30/0197; H10D 30/501; H10D 30/502; H10D 30/503; H10D 30/504; H10D 30/506; H10D 30/507; H10D 30/508; H10D 84/08; H01L 21/02233; H01L 21/02532; B82Y 10/00
See application file for complete search history.

(56) References Cited

U.S. PATENT DOCUMENTS

| | | | |
|---|---|---|---|
| 9,178,067 B1 | 11/2015 | Ching et al. | |
| 9,196,522 B2 | 11/2015 | Ching et al. | |
| 9,209,185 B2* | 12/2015 | Ching | H10D 30/024 |
| 9,595,475 B2* | 3/2017 | Liaw | H01L 21/3086 |
| 9,721,955 B2 | 8/2017 | Ching et al. | |
| 9,780,214 B2 | 10/2017 | Huang et al. | |
| 9,812,530 B2 | 11/2017 | Balakrishnan et al. | |
| 9,871,115 B1* | 1/2018 | Hong | H10B 10/12 |
| 9,882,032 B2 | 1/2018 | Ching et al. | |
| 10,032,678 B2* | 7/2018 | Xu | H10D 62/121 |
| 10,354,930 B2* | 7/2019 | Liu | G01R 27/205 |
| 10,468,528 B2* | 11/2019 | Ching | H10D 64/667 |
| 10,604,407 B2 | 3/2020 | Cao et al. | |
| 10,868,186 B2 | 12/2020 | Chiang et al. | |
| 2017/0301555 A1* | 10/2017 | Bi | H10D 62/122 |
| 2020/0328123 A1 | 10/2020 | Liu et al. | |
| 2021/0013111 A1 | 1/2021 | Smith et al. | |
| 2022/0416046 A1* | 12/2022 | Li | H10D 30/014 |

* cited by examiner

SEMICONDUCTOR DEVICE

CROSS-REFERENCE TO RELATED APPLICATION

This U.S. nonprovisional application claims priority under 35 U.S.C. § 119 to Korean Patent Application No. 10-2021-0160367, filed on Nov. 19, 2021, in the Korean Intellectual Property Office, the disclosure of which is hereby incorporated by reference in its entirety.

BACKGROUND

The present inventive concepts relate to a semiconductor device, and more particularly, to a semiconductor device including an electric field effect transistor.

Semiconductor devices have an important role in the electronic industry because of their small size, multi-functionality, and/or low fabrication cost. Data storage devices among the semiconductor devices can store logic data. A semiconductor device has been increasingly required for high integration with the advanced development of the electronic industry. For example, semiconductor devices have been increasingly requested for high reliability, high speed, and/or multi-functionality. Semiconductor devices are gradually becoming more complicated and more integrated to meet these requested characteristics.

SUMMARY

Some embodiments of the present inventive concepts provide a semiconductor device with increased electrical properties.

According to some embodiments of the present inventive concepts, a semiconductor device may comprise: a substrate that includes a first PMOSFET region and a second PMOSFET region; a first active pattern and a second active pattern on the first PMOSFET region and a second PMOSFET region, respectively; a first channel pattern on the first active pattern and a second channel pattern on the second active pattern, each of the first and second channel patterns including a plurality of semiconductor patterns that are vertically stacked and spaced apart from each other; and a first source/drain pattern and a second source/drain pattern connected to the first channel pattern and the second channel pattern, respectively. The first active pattern may include a first lower semiconductor layer, a first middle semiconductor layer, and a first upper semiconductor layer that are sequentially stacked. Each of the first lower semiconductor layer and the first upper semiconductor layer may include silicon. The first middle semiconductor layer may include silicon-germanium (SiGe). A width of the first middle semiconductor layer may decrease in a downward direction to a minimum value and then increase in the downward direction.

According to some embodiments of the present inventive concepts, a semiconductor device may comprise: a substrate including a first PMOSFET region and a second PMOSFET region that are spaced apart from each other in a first direction; a first active pattern and a second active pattern on the first PMOSFET region and the second PMOSFET region, respectively, the first active pattern including one active fin, and the second active pattern including a plurality of active fins; a first channel pattern on the first active pattern and a second channel pattern on the second active pattern, each of the first and second channel patterns including a plurality of semiconductor patterns that are vertically stacked and spaced apart from each other; a gate electrode that extends in the first direction and surrounds the semiconductor patterns; and a first source/drain pattern and a second source/drain pattern connected to the first channel pattern and the second channel pattern, respectively. The first active pattern may include a middle semiconductor layer spaced apart from the first source/drain pattern. The middle semiconductor layer may include silicon-germanium. A width of the middle semiconductor layer may decrease in a downward direction to a minimum value and then increase in the downward direction. A bottom surface of the first source/drain pattern may be at a level higher than a level of a bottom surface of the second source/drain pattern.

According to some embodiments of the present inventive concepts, a semiconductor device may comprise: a substrate including a first PMOSFET region, a second PMOSFET region, and an NMOSFET region that are spaced apart from each other in a first direction; a first active pattern on the first PMOSFET region, a second active pattern on the second PMOSFET region, and a third active pattern on the NMOSFET region; a first source/drain pattern on the first active pattern, a second source/drain pattern on the second active pattern, and a third source/drain pattern on the third active pattern; a first channel pattern connected to the first source/drain pattern, a second channel pattern connected to the second source/drain pattern, and a third channel pattern connected to the third source/drain pattern, each of the first to third channel patterns including a first semiconductor pattern, a second semiconductor pattern, and a third semiconductor pattern that are vertically stacked and spaced apart from each other; a gate electrode that extends in the first direction and runs across the first to third channel patterns, the gate electrode including a first portion between the substrate and the first semiconductor pattern, a second portion between the first semiconductor pattern and the second semiconductor pattern, a third portion between the second semiconductor pattern and the third semiconductor pattern, and a fourth portion on the third semiconductor pattern; a gate dielectric layer between the gate electrode and the first to third channel patterns; a gate spacer on a sidewall of the gate electrode; a gate capping pattern on a top surface of the gate electrode; a first interlayer dielectric layer on the gate capping pattern; a plurality of active contacts that penetrate the first interlayer dielectric layer and are correspondingly coupled to the first to third source/drain patterns; a gate contact that penetrates the first interlayer dielectric layer and is coupled to the gate electrode; a second interlayer dielectric layer on the first interlayer dielectric layer; a first metal layer in the second interlayer dielectric layer; a third interlayer dielectric layer on the second interlayer dielectric layer; and a second metal layer in the third interlayer dielectric layer. The first active pattern may include a first lower semiconductor layer, a first middle semiconductor layer, and a first upper semiconductor layer that are sequentially stacked. Each of the first lower semiconductor layer and the first upper semiconductor layer may include silicon. The first middle semiconductor layer may include silicon-germanium (SiGe). A width of the first middle semiconductor layer may decrease in a downward direction to a minimum value and then increases in the downward direction.

DETAILED DESCRIPTION

Example embodiments will be more clearly understood from the following detailed description taken in conjunction with the accompanying drawings, in which like numerals refer to like elements throughout.

Figure 1:
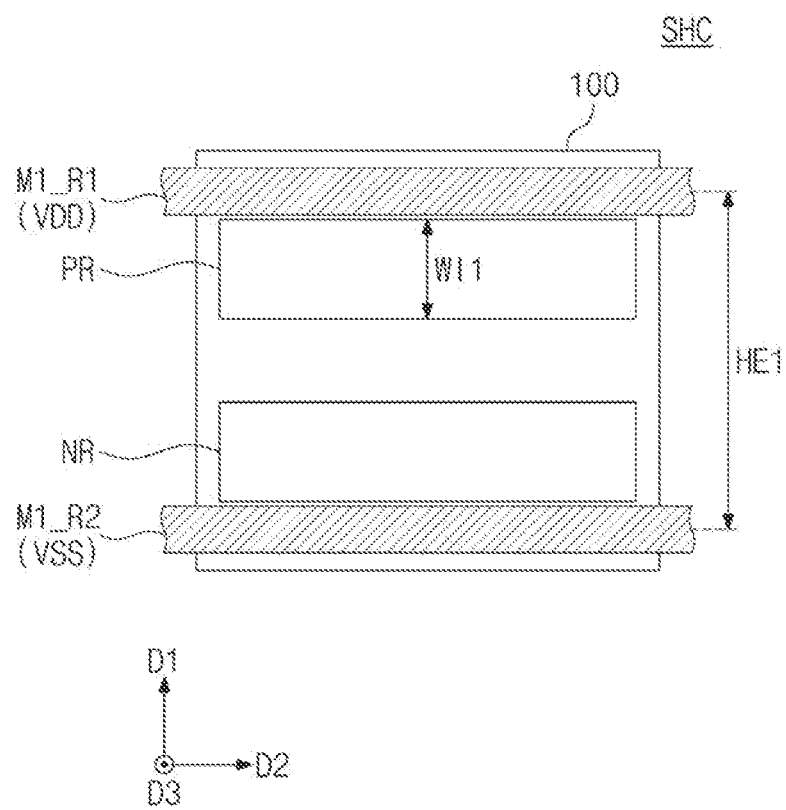
FIGS. 1 to 3 illustrate conceptual diagrams showing logic cells of a semiconductor device, according to example embodiments of the present inventive concepts.
Figure 2:
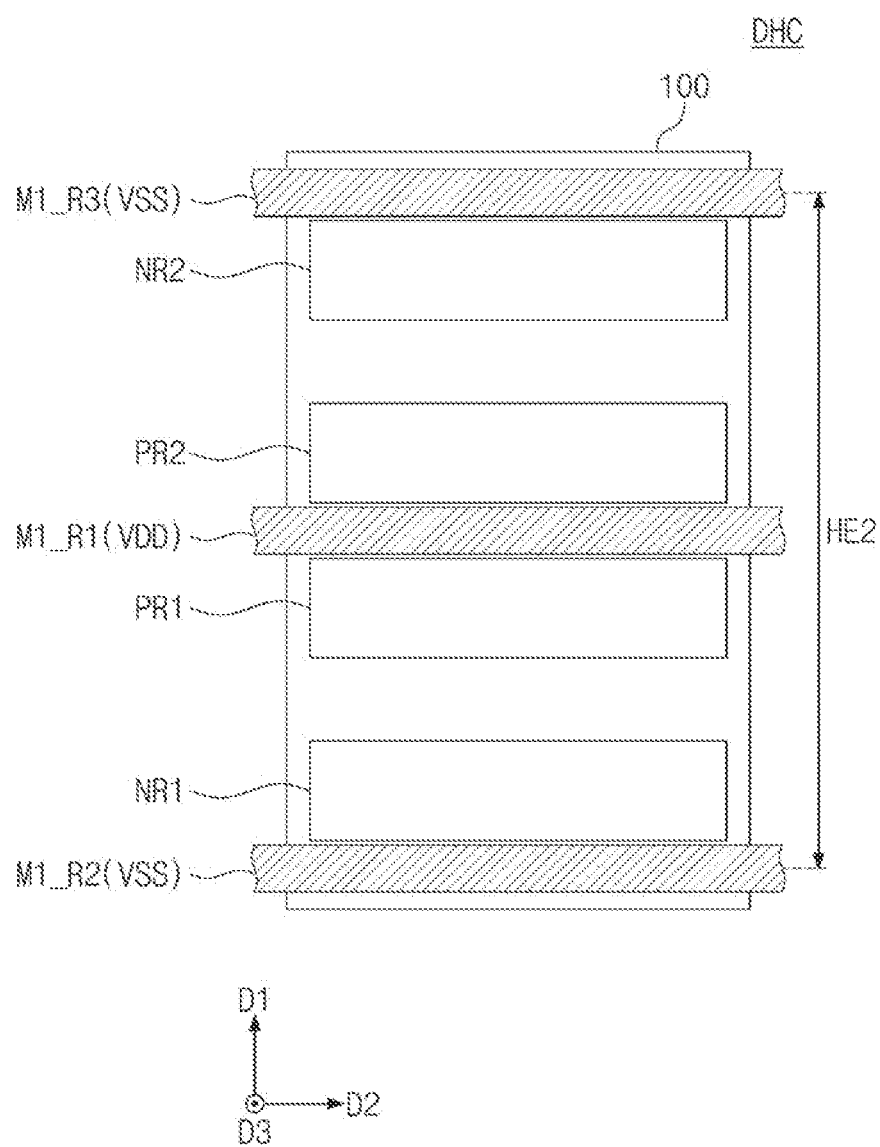
Figure 3:
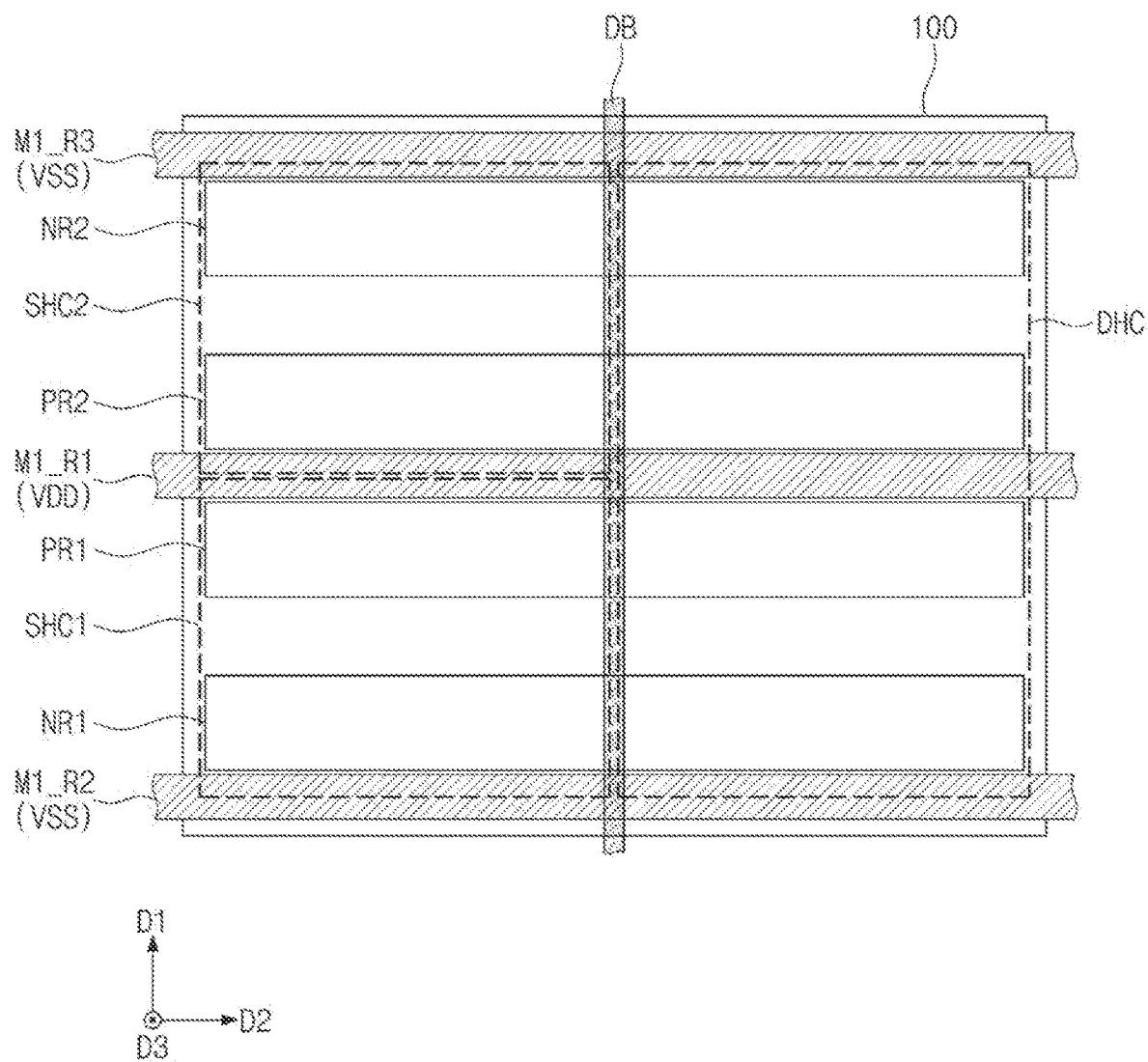

FIGS. 1 to 3 illustrate conceptual views showing logic cells of a semiconductor device, according to example embodiments of the present inventive concepts.

Referring to FIG. 1, a single height cell SHC may be provided. For example, a substrate 100 may be provided thereon with a first power line M1_R1 and a second power line M1_R2. The first power line M1_R1 may be a path for providing a drain voltage VDD, for example, a power voltage. The second power line M1_R2 may be a path for providing a source voltage VSS, for example, a ground voltage.

The single height cell SHC may be defined between the first power line M1_R1 and the second power line M1_R2. The single height cell SHC may include one PMOSFET region PR and one NMOSFET region NR. For example, the single height cell SHC may have a complementary metal oxide semiconductor (CMOS) structure provided between the first power line M1_R1 and the second power line M1_R2.

Each of the PMOSFET and NMOSFET regions PR and NR may have a first width WI1 in a first direction D1. A first height HE1 may be defined to indicate a length in the first direction D1 of the single height cell SHC. The first height HE1 may be substantially the same as a distance (e.g., pitch) between the first power line M1_R1 and the second power line M1_R2. As used herein, terms such as "same," "equal," "planar," or "coplanar," when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise.

The single height cell SHC may constitute one logic cell. In this description, the logic cell may mean a logic device, such as AND, OR, XOR, XNOR, and inverter, that performs a specific function. For example, the logic cell may include transistors for constituting a logic device, and may also include wiring lines that connect the transistors to each other.

Referring to FIG. 2, a double height cell DHC may be provided. For example, a substrate 100 may be provided thereon with a first power line M1_R1, a second power line M1_R2, and a third power line M1_R3. The first power line M1_R1 may be disposed between the second power line M1_R2 and the third power line M1_R3. The third power line M1_R3 may be a path for providing a source voltage VSS.

The double height cell DHC may be defined between the second power line M1_R2 and the third power line M1_R3. The double height cell DHC may include a first PMOSFET region PR1, a second PMOSFET region PR2, a first NMOSFET region NR1, and a second NMOSFET region NR2.

The first NMOSFET region NR1 may be adjacent to the second power line M1_R2. The second NMOSFET region NR2 may be adjacent to the third power line M1_R3. The first and second PMOSFET regions PR1 and PR2 may be adjacent to the first power line M1_R1. When viewed in plan, the first power line M1_R1 may be located between the first and second PMOSFET regions PR1 and PR2.

A second height HE2 may be defined to indicate a length in the first direction D1 of the double height cell DHC. The second height HE2 may be substantially the same as a distance (e.g., pitch) between the second power line M1_R2 and the third power line M1_R3. The second height HE2 may be about twice the first height HE1 of FIG. 1. The first and second PMOSFET regions PR1 and PR2 of the double height cell DHC may be collectively coupled to operate as a single PMOSFET region.

Therefore, the double height cell DHC may have a PMOS transistor whose size is greater than that of a PMOS transistor included in the single height cell SHC discussed above in FIG. 1. For example, the channel size of the PMOS transistor included in the double height cell DHC may be about twice that of the PMOS transistor included in the single height cell SHC. As a result, the double height cell DHC may operate at higher speeds than those of the single height cell SHC. In the present inventive concepts, the double height cell DHC shown in FIG. 2 may be defined as a multi-height cell. Although not shown, the multi-height cell may include a triple height cell whose cell height is about three times that of the single height cell SHC.

Referring to FIG. 3, a substrate 100 may be provided thereon with a first single height cell SHC1, a second single height cell SHC2, and a double height cell DHC that are two-dimensionally disposed. The first single height cell SHC1 may be located between a first power line M1_R1 and a second power line M1_R2. The second single height cell SHC2 may be located between the first power line M1_R1 and the third power line M1_R3. The second single height cell SHC2 may be adjacent in a first direction D1 to the first single height cell SHC1.

The double height cell DHC may be located between the second power line M1_R2 and the third power line M1_R3. The double height cell DHC may be adjacent in a second direction D2 to the first and second single height cells SHC1 and SHC2.

A separation structure DB may be provided between the first single height cell SHC1 and the double height cell DHC and between the second single height cell SHC2 and the double height cell DHC. The separation structure DB may electrically separate an active region of the double height cell DHC from an active region of each of the first and second single height cells SHC1 and SHC2.

Figure 4:
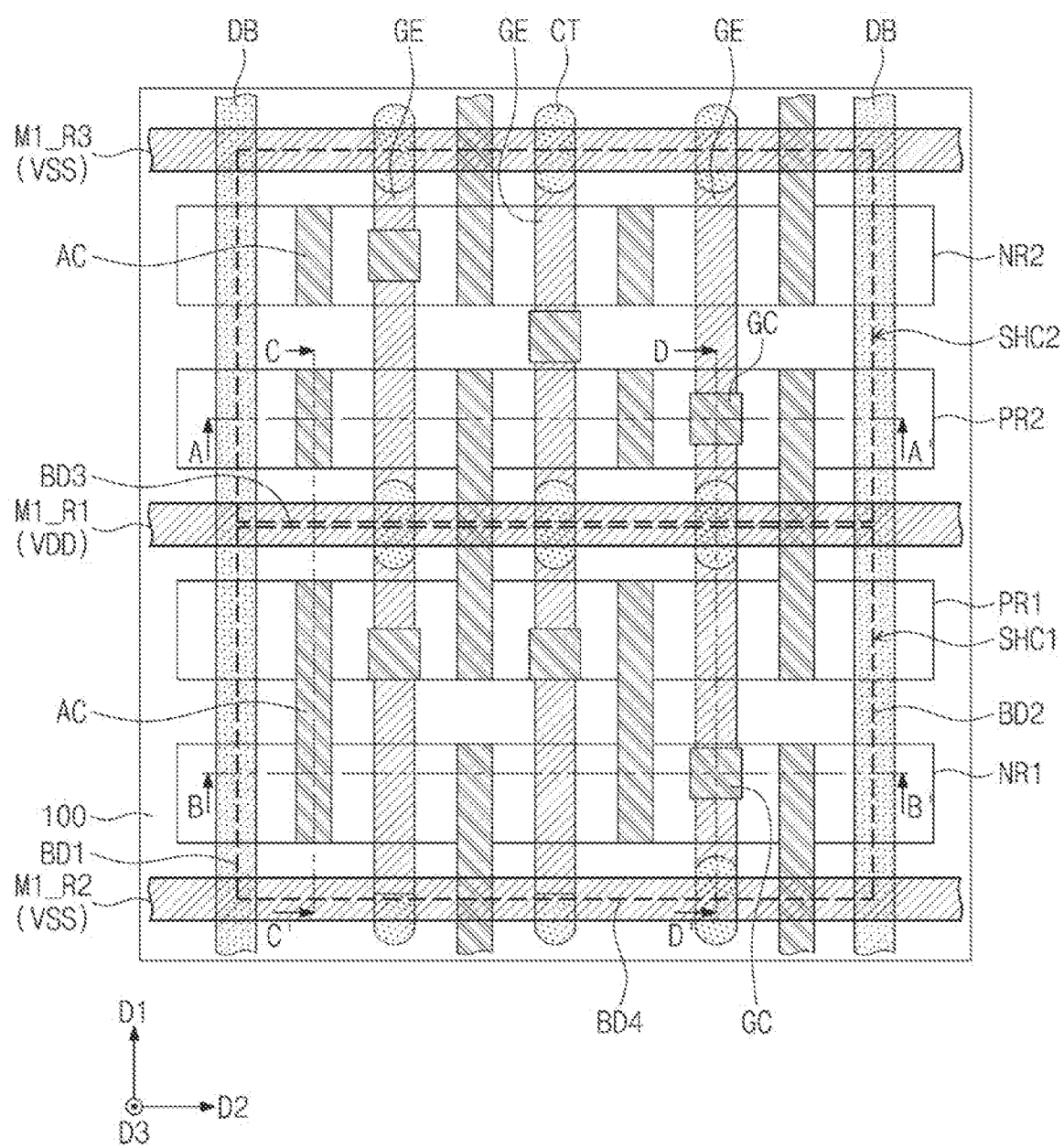
FIG. 4 illustrates a plan view showing a semiconductor device, according to example embodiments of the present inventive concepts.

FIG. 4 illustrates a plan view showing a semiconductor device according to example embodiments of the present inventive concepts. FIGS. 5A, 5B, 5C, and 5D illustrate cross-sectional views respectively taken along lines A-A', B-B', C-C', and D-D' of FIG. 4. FIG. 6 illustrates an enlarged cross-sectional view showing section M of FIG. 5C. A semiconductor device shown in FIGS. 4 and 5A to 5D is a detailed example of the first and second single height cells SHC1 and SHC2 depicted in FIG. 2.

Referring to FIGS. 4 and 5A to 5D, a substrate 100 may be provided thereon with first and second single height cells SHC1 and SHC2. Each of the first and second single height cells SHC1 and SHC2 may include logic transistors included in a logic circuit. The substrate 100 may be a compound semiconductor substrate or a semiconductor substrate including silicon, germanium, or silicon-germanium. For example, the substrate 100 may be a silicon substrate.

The substrate 100 may have a first PMOSFET region PR1, a second PMOSFET region PR2, a first NMOSFET region NR1, and a second NMOSFET region NR2. Each of the first PMOSFET region PR1, the second PMOSFET region PR2, the first NMOSFET region NR1, and the second NMOSFET region NR2 may extend lengthwise in a second direction D2. The first single height cell SHC1 may include the first NMOSFET region NR1 and the first PMOSFET region PR1, and the second single height cell SHC2 may include the second PMOSFET region PR2 and the second NMOSFET region NR2.

A first active pattern AP1 and a second active pattern AP2 may be defined by a trench TR formed on an upper portion of the substrate 100. The first active pattern AP1 may be provided on each of the first and second PMOSFET regions PR1 and PR2. The second active pattern AP2 may be provided on each of the first and second NMOSFET regions NR1 and NR2. The first and second active patterns AP1 and AP2 may extend lengthwise in the second direction D2. The first and second active patterns AP1 and AP2 may be vertically protruding portions of the substrate 100.

On the first single height cell SHC1, each of the first and second active patterns AP1 and AP2 may include a plurality of active fins AF1 and AF2. For example, on the first single height cell SHC1, each of the first and second active patterns AP1 and AP2 may include a first active fin AF1 and a second active fin AF2.

On the second single height cell SHC2, each of the first and second active patterns AP1 and AP2 may include one active fin. Differently from that shown in figures, the number of active fins is freely changed.

The trench TR may be filled with a device isolation layer ST. The device isolation layer ST may include silicon oxide. The device isolation layer ST may not cover any of first and second channel patterns CH1 and CH2 which will be discussed below.

A first channel pattern CH1 may be provided on the first active pattern AP1. A second channel pattern CH2 may be provided on the second active pattern AP2. Each of the first and second channel patterns CH1 and CH2 may include a first semiconductor pattern SP1, a second semiconductor pattern SP2, and a third semiconductor pattern SP3 that are sequentially stacked. The first, second, and third semiconductor patterns SP1, SP2, and SP3 may be spaced apart from each other in a vertical direction or a third direction D3.

The first, second, and third semiconductor patterns SP1, SP2, and SP3 may include one or more of silicon (Si), germanium (Ge), and silicon-germanium (SiGe). For example, each of the first, second, and third semiconductor patterns SP1, SP2, and SP3 may include crystalline silicon.

A plurality of first source/drain patterns SD1 may be provided on the first active pattern AP1 of the second single height cell SHC2. A plurality of first recesses RS1 may be formed on an upper portion of the first active pattern AP1 on the second single height cell SHC2. The first source/drain patterns SD1 may be provided in corresponding first recesses RS1. The first source/drain patterns SD1 may be impurity regions having a first conductivity type (e.g., p-type). A first channel pattern CH1 may be interposed between a pair of first source/drain patterns SD1. For example, the pair of first source/drain patterns SD1 may be connected to each other through the stacked first, second, and third semiconductor patterns SP1, SP2, and SP3 of the first channel pattern CH1.

A plurality of first source/drain patterns SD1 may be provided on the first active pattern AP1 of the first single height cell SHC1. A plurality of second recesses RS2 may be formed on an upper portion of the first active pattern AP1 on the first single height cell SHC1. The first source/drain patterns SD1 may be provided in corresponding second recesses RS2. On the first single height cell SHC1, the first source/drain pattern SD1 may be provided on the first active fin AF1 and the second active fin AF2 of the first active pattern AP1. On the first single height cell SHC1, the first source/drain pattern SD1 may connect to each other the first active fin AF1 and the second active fin AF2.

A plurality of second source/drain patterns SD2 may be provided on the second active pattern AP2. A plurality of third recesses RS3 may be formed on an upper portion of the second active pattern AP2. The second source/drain patterns SD2 may be provided in corresponding third recesses RS3. The second source/drain patterns SD2 may be impurity regions having a second conductivity type (e.g., n-type). The second channel pattern CH2 may be interposed between a pair of second source/drain patterns SD2. For example, the pair of second source/drain patterns SD2 may be connected to each other through the stacked first, second, and third semiconductor patterns SP1, SP2, and SP3 of the second channel pattern CH2.

The first and second source/drain patterns SD1 and SD2 may be epitaxial patterns formed by a selective epitaxial growth (SEG) process. For example, the first and second source/drain patterns SD1 and SD2 may have their top surfaces higher than that of the third semiconductor pattern SP3. For another example, at least one of the first and second source/drain patterns SD1 and SD2 may have a top surface located at substantially the same level as that of a top surface of the third semiconductor pattern SP3.

The first source/drain patterns SD1 may include a semiconductor element (e.g., SiGe) whose lattice constant is greater than that of a semiconductor element of the substrate 100. Therefore, a pair of first source/drain patterns SD1 may provide the first channel pattern CH1 with compressive stress. The second source/drain patterns SD2 may include the same semiconductor element (e.g., Si) as that of the substrate 100.

Each of the first source/drain patterns SD1 may include a first semiconductor layer SEL1 and a second semiconductor layer SEL2 on the first semiconductor layer SEL1. The first semiconductor layer SEL1 may cover an inner wall of one of the first and second recesses RS1 and RS2. The first semiconductor layer SEL1 may have a thickness that decreases in a direction from lower toward upper portions thereof. For example, a thickness in the third direction D3 of the first semiconductor layer SEL1 on a bottom surface of the first recess RS1 may be greater than a thickness in the second direction D2 of the first semiconductor layer SEL1 on an upper portion of the first recess RS1. The first semiconductor layer SEL1 may be shaped like U along a profile of the first recess RS1. The second semiconductor layer SEL2 may fill an unoccupied portion of the first recess RS1 filled with the first semiconductor layer SEL1. The second semiconductor layer SEL2 may have a volume greater than that of the first semiconductor layer SEL1.

Each of the first and second semiconductor layers SEL1 and SEL2 may include silicon-germanium (SiGe). For example, the first semiconductor layer SEL1 may contain germanium (Ge) whose concentration is relatively low. In some embodiments of the present inventive concepts, the first semiconductor layer SEL1 may include only silicon (Si) and may not include germanium (Ge). The first semiconductor layer SEL1 may contain germanium (Ge) whose concentration ranges from about 0 at % to about 10 at %.

The second semiconductor layer SEL2 may contain germanium (Ge) whose concentration is relatively high. For example, the second semiconductor layer SEL2 may contain germanium (Ge) whose concentration ranges from about 30 at % to about 55 at %. The concentration of germanium (Ge) contained in the second semiconductor layer SEL2 may increase in the third direction D3.

The first and second semiconductor layers SEL1 and SEL2 may include impurities (e.g., boron) that cause the first source/drain pattern SD1 to have a p-type. An impurity concentration (e.g., atomic percent) of the second semiconductor layer SEL2 may be greater than that of the first semiconductor layer SEL1.

The first semiconductor layer SEL1 may protect the second semiconductor layer SEL2 while sacrificial layers SAL are replaced with first, second, and third portions PO1, PO2, and PO3 of a gate electrode GE which will be discussed below. For example, the first semiconductor layer SEL1 may prevent the second semiconductor layer SEL2 from being etched with an etching material that etches the sacrificial layers SAL.

On the second single height cell SHC2, the first source/drain pattern SD1 may have a bottom surface located at a first level LV1. On the first single height cell SHC1, the first source/drain pattern SD1 may have a bottom surface located at a second level LV2. The first level LV1 may be positioned higher than the second level LV2. The second source/drain pattern SD2 may have a bottom surface located at a third level LV3. The first and third levels LV1 and LV3 may be substantially the same as each other. For example, based on characteristics of a transistor in a semiconductor device, there may be selectively formed a middle semiconductor layer MSL, which will be described below, below the first source/drain pattern SD1.

A plurality of gate electrodes GE may be provided to extend lengthwise in a first direction D1 and to run across the first and second channel patterns CH1 and CH2. The gate electrodes GE may be arranged at a first pitch in the second direction D2. Each of the gate electrodes GE may vertically overlap corresponding ones of the first and second channel patterns CH1 and CH2.

The gate electrode GE may include a first portion PO1 interposed between the first semiconductor pattern SP1 and the active pattern AP1 or AP2, a second portion PO2 between the first semiconductor pattern SP1 and the second semiconductor pattern SP2, a third portion PO3 between the second semiconductor pattern SP2 and the third semiconductor pattern SP3, and a fourth portion PO4 on the third semiconductor pattern SP3.

Referring back to FIG. 5A, different widths may be given to the first, second, and third portions PO1, PO2, and PO3 of the gate electrode GE on the PMOSFET region PR1 or PR2. For example, a maximum width in the second direction D2 of the third portion PO3 may be greater than a maximum width in the second direction D2 of the second portion PO2. A maximum width in the second direction D2 of the first portion PO1 may be greater than the maximum in the second direction D2 of the third portion PO3.

Referring back to FIG. 5D, the gate electrode GE may be provided on a top surface TS, a bottom surface BS, and opposite sidewalls SW of each of the first, second, and third semiconductor patterns SP1, SP2, and SP3. For example, a transistor according to some embodiments may be a three-dimensional field effect transistor (e.g., multi-bridge channel field effect transistor (MBCFET) or a gate-all-around field effect transistor (GAAFET)) in which a gate electrode three-dimensionally surrounds a channel.

Referring back to FIGS. 4 and 5A to 5D, the first single height cell SHC1 may have a first boundary BD1 and a second boundary BD2 that are opposite to each other in the second direction D2. The first and second boundaries BD1 and BD2 may extend lengthwise in the first direction D1. The first single height cell SHC1 may have a third boundary BD3 and a fourth boundary BD4 that are opposite to each other in the first direction D1. The third and fourth boundaries BD3 and BD4 may extend lengthwise in the second direction D2.

Gate cutting patterns CT may be located on a boundary in the second direction D2 on each of the first and second single height cells SHC1 and SHC2. For example, the gate cutting patterns CT may be located on the third and fourth boundaries BD3 and BD4 of the first single height cell SHC1. The gate cutting patterns CT may be arranged at the first pitch along the third boundary BD3. The gate cutting patterns CT may be arranged at the first pitch along the fourth boundary BD4. When viewed in plan, the gate cutting patterns CT on the third and fourth boundaries BD3 and BD4 may be located to overlap corresponding gate electrodes GE. The gate cutting patterns CT may include a dielectric material, such as a silicon oxide layer, a silicon nitride layer, or a combination thereof.

The gate cutting pattern CT may separate the gate electrode GE on the first single height cell SHC1 from the gate electrode GE on the second single height cell SHC2. The gate cutting pattern CT may be interposed between the gate electrode GE on the first single height cell SHC1 and the gate electrode GE on the second single height cell SHC2, which gate electrodes GE are aligned with each other in the first direction D1. For example, the gate cutting patterns CT may divide the gate electrode GE, which extends in the first direction D1, into a plurality of gate electrodes GE.

A pair of gate spacers GS may be located on opposite sidewalls of the fourth portion PO4 of the gate electrode GE. The gate spacers GS may extend lengthwise in the first direction D1 along the gate electrode GE. The gate spacers GS may have their top surfaces higher than that of the gate electrode GE. The top surfaces of the gate spacers GS may be coplanar with that of a first interlayer dielectric layer 110 which will be discussed below. For example, the gate spacers GS may include at least one selected from SiCN, SiCON, and SiN. Alternatively, the gate spacers GS may include a multi-layer formed of at least two selected from SiCN, SiCON, and S iN.

A gate capping pattern GP may be provided on the gate electrode GE. The gate capping pattern GP may extend in the first direction D1 along the gate electrode GE. The top surfaces of the gate capping pattern GP may be coplanar with the top surfaces of the gate spacers GS. The gate capping pattern GP may include a material having an etch selectivity with respect to first and second interlayer dielectric layers 110 and 120 which will be discussed below. For example, the gate capping pattern GP may include at least one selected from SiON, SiCN, SiCON, and SiN.

A gate dielectric layer GI may be interposed between the gate electrode GE and the first channel pattern CH1 and between the gate electrode GE and the second channel pattern CH2. The gate dielectric layer GI may cover the top surface TS, the bottom surface BS, and the opposite sidewalls SW of each of the first, second, and third semiconductor patterns SP1, SP2, and SP3. The gate dielectric layer GI may cover a top surface of the device isolation layer ST below the gate electrode GE.

In some embodiments of the present inventive concepts, the gate dielectric layer GI may include one or more of a silicon oxide layer, a silicon oxynitride layer, and a high-k dielectric layer. The high-k dielectric layer may include a high-k dielectric material whose dielectric constant is greater than that of a silicon oxide layer. For example, the high-k dielectric material may include at least one selected from hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

In some example embodiments, a semiconductor device according to the present inventive concepts may include a negative capacitance field effect transistor that uses a negative capacitor. For example, the gate dielectric layer GI may include a ferroelectric material layer that exhibits ferroelectric properties and a paraelectric material layer that exhibits paraelectric properties.

The ferroelectric material layer may have a negative capacitance, and the paraelectric material layer may have a positive capacitance. For example, when two or more capacitors are connected in series, and when each capacitor has a positive capacitance, an overall capacitance may be reduced to be less than the capacitance of each capacitor. In contrast, when at least one of two or more capacitors connected in series has a negative capacitance, an overall capacitance may have a positive value that is increased to be greater than an absolute value of the capacitance of each capacitor.

When the ferroelectric material layer having a negative capacitance is connected in series to the paraelectric material layer having a positive capacitance, there may be an increase in overall capacitance of the ferroelectric and paraelectric material layers that are connected in series. The increase in overall capacitance may be used to allow a transistor including the ferroelectric material layer to have a sub-threshold swing (SS) of less than about 60 mV/decade at room temperature.

The ferroelectric material layer may have ferroelectric properties. The ferroelectric material layer may include, for example, at least one selected from hafnium oxide, hafnium zirconium oxide, barium strontium titanium oxide, and lead zirconium titanium oxide. For example, the hafnium zirconium oxide may be a material in which hafnium oxide is doped with zirconium (Zr). For another example, the hafnium zirconium oxide may be a compound of hafnium (Hf), zirconium (Zr), and oxygen (O).

The ferroelectric material layer may further include impurities doped therein. For example, the impurities may include at least one selected from aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn). The type of impurities included in the ferroelectric material layer may be changed depending on what ferroelectric material is included in the ferroelectric material layer.

When the ferroelectric material layer includes hafnium oxide, the ferroelectric material layer may include at least one of impurities such as gadolinium (Gd), silicon (Si), zirconium (Zr), aluminum (Al), and yttrium (Y).

When the impurities are aluminum (Al), the ferroelectric material layer may include about 3 to 8 atomic percent aluminum. In this description, the ratio of impurities may be a ratio of aluminum to the sum of hafnium and aluminum.

When the impurities are silicon (Si), the ferroelectric material layer may include about 2 to about 10 atomic percent silicon. When the impurities are yttrium (Y), the ferroelectric material layer may include about 2 to about 10 atomic percent yttrium. When the impurities are gadolinium (Gd), the ferroelectric material layer may include about 1 to about 7 atomic percent gadolinium. When the impurities are zirconium (Zr), the ferroelectric material layer may include about 50 to 80 atomic percent zirconium.

The paraelectric material layer may have paraelectric properties. The paraelectric material layer may include, for example, at least one selected from silicon oxide and high-k metal oxide. The metal oxide included in the paraelectric material layer may include, for example, at least one selected from hafnium oxide, zirconium oxide, and aluminum oxide, but the present inventive concepts are not limited thereto.

The ferroelectric and paraelectric material layers may include the same material. The ferroelectric material layer may have ferroelectric properties, but the paraelectric material layer may not have ferroelectric properties. For example, when the ferroelectric material layer and the paraelectric material layer include hafnium oxide, the hafnium oxide included in the ferroelectric material layer may have a crystal structure different from that of the hafnium oxide included in the paraelectric material layer.

The ferroelectric material layer may have a thickness having ferroelectric properties. The thickness of the ferroelectric material layer may range, for example, from about 0.5 nm to about 10 nm, but the present inventive concepts are not limited thereto. Because ferroelectric materials have their own critical thickness that exhibits ferroelectric properties, the thickness of the ferroelectric material layer may depend on ferroelectric material.

For example, the gate dielectric layer GI may include a single ferroelectric material layer. For another example, the gate dielectric layer GI may include a plurality of ferroelectric material layers that are spaced apart from each other. The gate dielectric layer GI may have a stack structure in which a plurality of ferroelectric material layers are alternately stacked with a plurality of paraelectric material layers.

The gate electrode GE may include a first metal pattern and a second metal pattern on the first metal pattern. The first metal pattern may be provided on the gate dielectric layer GI and may be adjacent to the first, second, and third semiconductor patterns SP1, SP2, and SP3. The first metal pattern may include a work-function metal that controls a threshold voltage of a transistor. A thickness and composition of the first metal pattern may be adjusted to achieve a desired threshold voltage of a transistor. For example, the first, second, and third portions PO1, PO2, and PO3 of the gate electrode GE may be formed of the first metal pattern or a work-function metal.

The first metal pattern may include a metal nitride layer. For example, the first metal pattern may include nitrogen (N)

and at least one metal selected from titanium (Ti), tantalum (Ta), aluminum (Al), tungsten (W), and molybdenum (Mo). In addition, the first metal pattern may further include carbon (C). The first metal pattern may include a plurality of stacked work-function metal layers.

The second metal pattern may include metal whose resistance is less than that of the first metal pattern. For example, the second metal pattern may include at least one metal selected from tungsten (W), aluminum (Al), titanium (Ti), and tantalum (Ta). For example, the fourth portion PO4 of the gate electrode GE may include a first metal pattern and a second metal pattern on the first metal pattern.

Referring back to FIG. 5B, inner spacers IP may be provided on the first and second NMOSFET regions NR1 and NR2. For example, the inner spacers IP may be provided on the second active pattern AP2. The inner spacers IP may be correspondingly interposed between the second source/drain pattern SD2 and the first, second, and third portions PO1, PO2, and PO3 of the gate electrode GE. The inner spacers IP may be in direct contact with the second source/drain pattern SD2. The inner spacer IP may separate the second source/drain pattern SD2 from each of the first, second, and third portions PO1, PO2, and PO3 of the gate electrode GE.

A first interlayer dielectric layer 110 may be provided on the substrate 100. The first interlayer dielectric layer 110 may cover the gate spacers GS and the first and second source/drain patterns SD1 and SD2. The first interlayer dielectric layer 110 may have a top surface substantially coplanar with that of the gate capping pattern GP and that of the gate spacer GS. The first interlayer dielectric layer 110 may be provided thereon with a second interlayer dielectric layer 120 that covers the gate capping pattern GP. A third interlayer dielectric layer 130 may be provided on the second interlayer dielectric layer 120. A fourth interlayer dielectric layer 140 may be provided on a third interlayer dielectric layer 130. For example, the first to fourth interlayer dielectric layers 110 to 140 may include a silicon oxide layer.

Each of the first and second single height cells SHC1 and SHC2 may be provided on its opposite sides with a pair of separation structures DB that are opposite to each other in the second direction D2. For example, a pair of separation structures DB may be correspondingly provided on first and second boundaries BD1 and BD2 of the first single height cell SHC1. The separation structure DB may extend lengthwise in the first direction D1 parallel to the gate electrodes GE. A pitch between the separation structure DB and its adjacent gate electrode GE may be the same as the first pitch.

The separation structure DB may penetrate the first and second interlayer dielectric layers 110 and 120 to extend into the first and second active patterns AP1 and AP2. The separation structure DB may penetrate the upper portion of each of the first and second active patterns AP1 and AP2. The separation structure DB may electrically separate an active region of each of the first and second single height cells SHC1 and SHC2 from an active region of another cell. Top surfaces of the separation structures DB may be coplanar with a top surface of the second interlayer dielectric layer 120.

There may be provided active contacts AC that penetrate the first and second interlayer dielectric layers 110 and 120 and correspondingly electrically connect to the first and second source/drain patterns SD1 and SD2. A pair of active contacts AC may be provided on opposite sides of the gate electrode GE. When viewed in plan, the active contact AC may have a bar shape that extends lengthwise in the first direction D1. A top surface of the active contact AC may be coplanar with a top surface of the second interlayer dielectric layer 120.

The active contact AC may be a self-aligned contact. For example, the gate capping pattern GP and the gate spacer GS may be used to form the active contact AC in a self-alignment manner. The active contact AC may cover, for example, at least a portion of a sidewall of the gate spacer GS. Although not shown, the active contact AC may cover a portion of the top surface of the gate capping pattern GP.

A metal-semiconductor compound layer SC, such as a silicide layer, may be interposed between the active contact AC and the first source/drain pattern SD1 and between the active contact AC and the second source/drain pattern SD2. The active contact AC may be electrically connected through the metal-semiconductor compound layer SC to the source/drain pattern SD1 or SD2. For example, the metal-semiconductor compound layer SC may include at least one selected from titanium-silicide, tantalum-silicide, tungsten-silicide, nickel-silicide, and cobalt-silicide.

Referring back to FIG. 5C, at least one active contact AC on the first single height cell SHC1 may electrically connect the first source/drain pattern SD1 of the first PMOSFET region PR1 to the second source/drain pattern SD2 of the first NMOSFET region NR1. The active contact AC may extend in the first direction D1 from the second source/drain pattern SD2 of the first NMOSFET region NR1 to the first source/drain pattern SD1 of the first PMOSFET region PR1.

Gate contacts GC may be provided to penetrate the second interlayer dielectric layer 120 and the gate capping pattern GP and to electrically connect to corresponding gate electrodes GE. When viewed in plan, two gate contacts GC on the first single height cell SHC1 may be located to overlap the first PMOSFET region PR1. For example, two gate contacts GC on the first single height cell SHC1 may be provided on the first active pattern AP1 (see FIG. 4). When viewed in plan, one gate contact GC on the first single height cell SHC1 may be located to overlap the first NMOSFET region NR1. For example, one gate contact GC on the first single height cell SHC1 may be provided on the second active pattern AP2 (see FIG. 5B).

On the gate electrode GE, the gate contact GC may be freely located with no limitation of position. For example, the gate contacts GC on the second single height cell SHC2 may be located on the second PMOSFET region PR2, the second NMOSFET region NR2, and the device isolation layer ST that fills the trench TR (see FIG. 4). Top surfaces of the gate contacts GC may be coplanar with a top surface of the second interlayer dielectric layer 120.

Figure 5A:
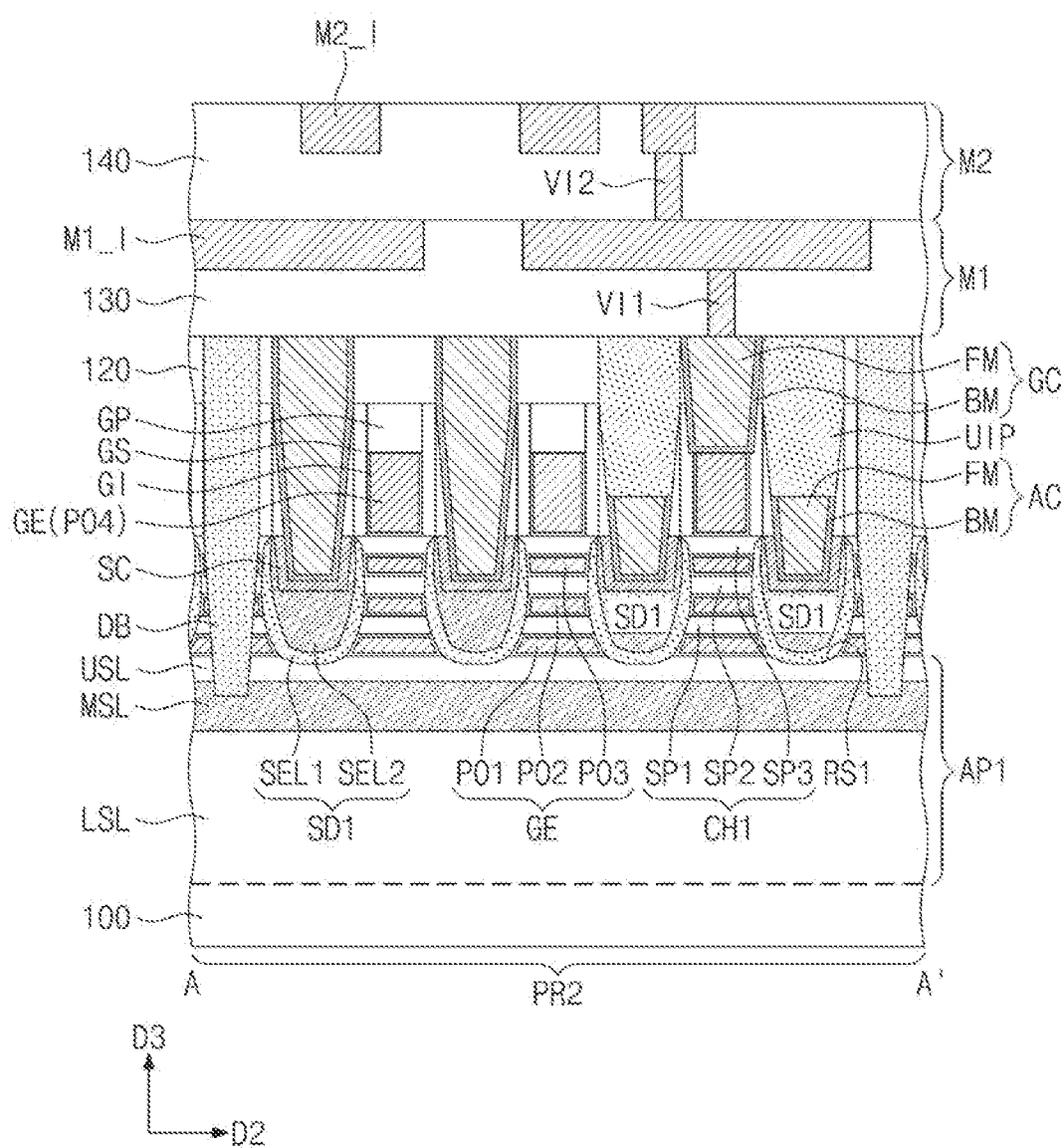
FIGS. 5A, 5B, 5C, and 5D illustrate cross-sectional views respectively taken along lines A-A', B-B', C-C', and D-D' of FIG. 4.
Figure 5B:
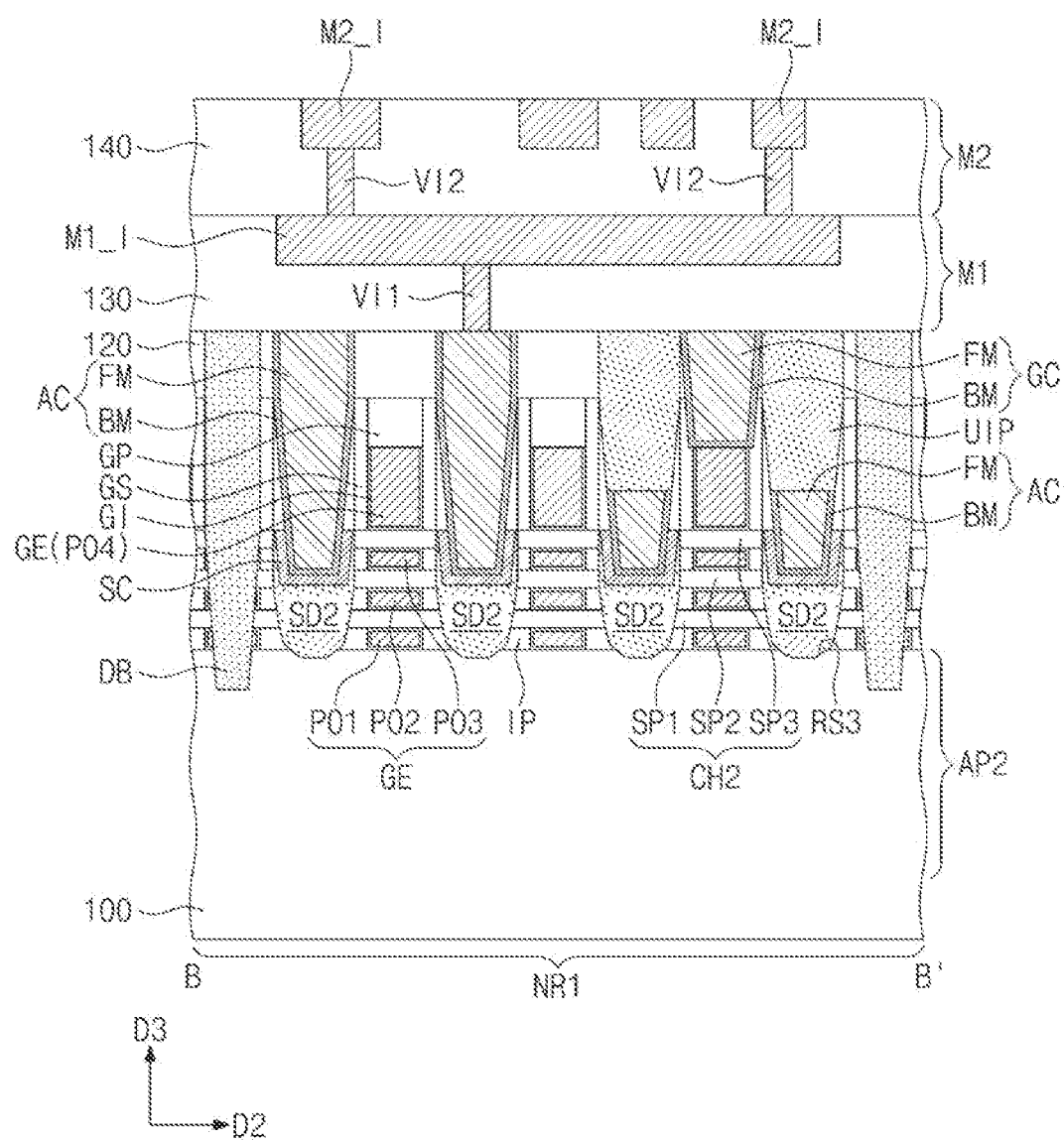
Figure 5C:
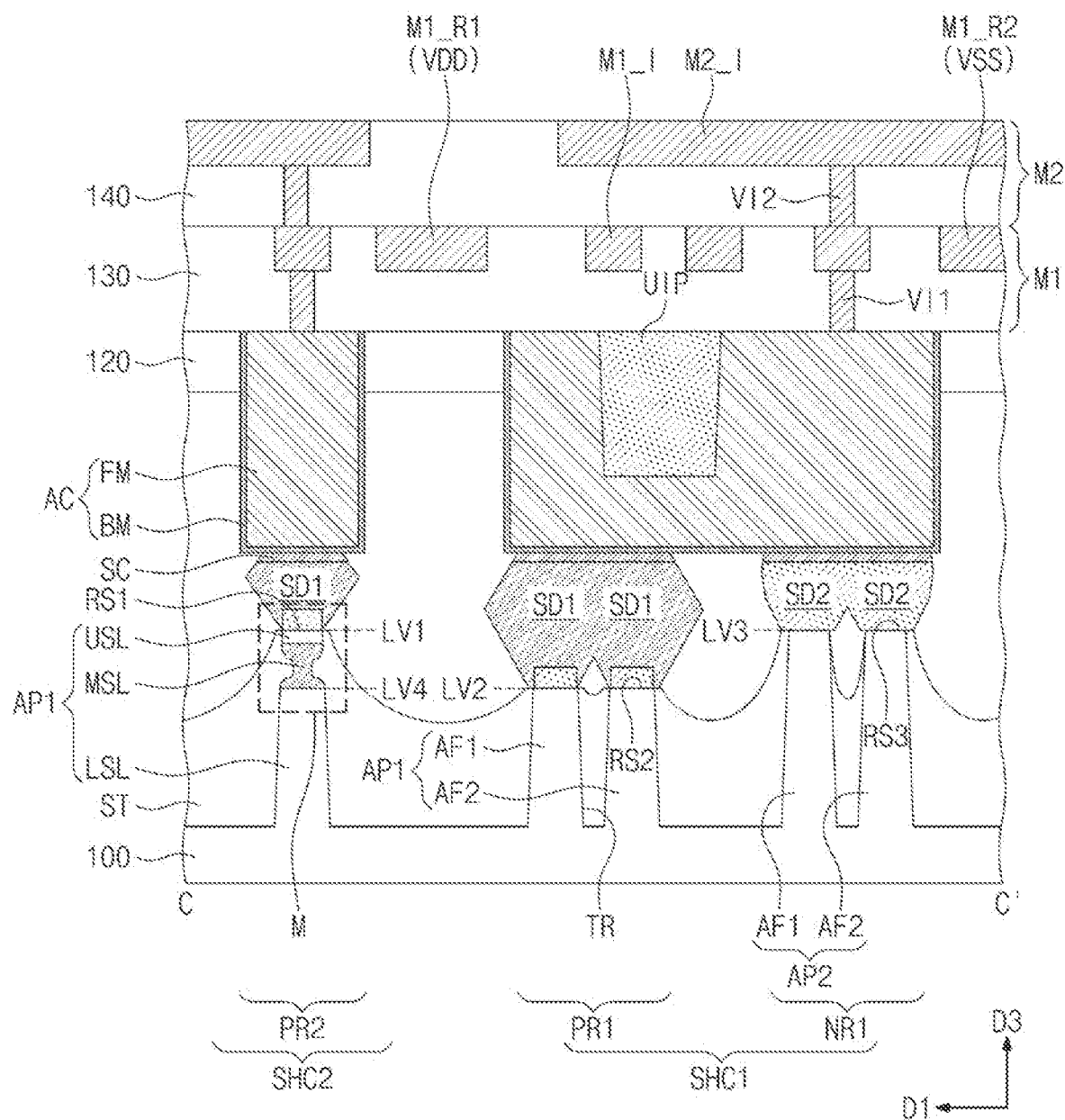
Figure 5D:
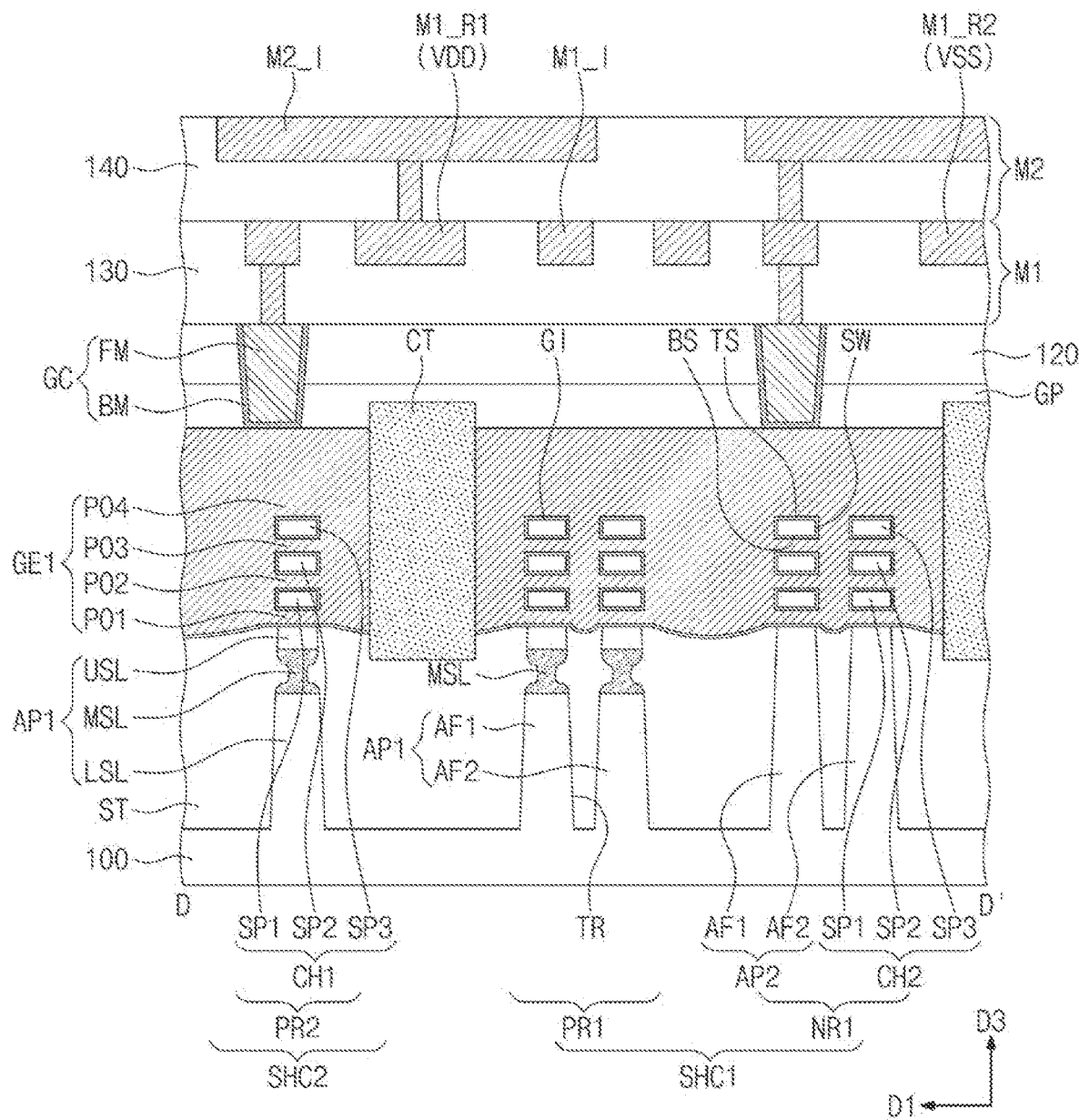
Figure 6:
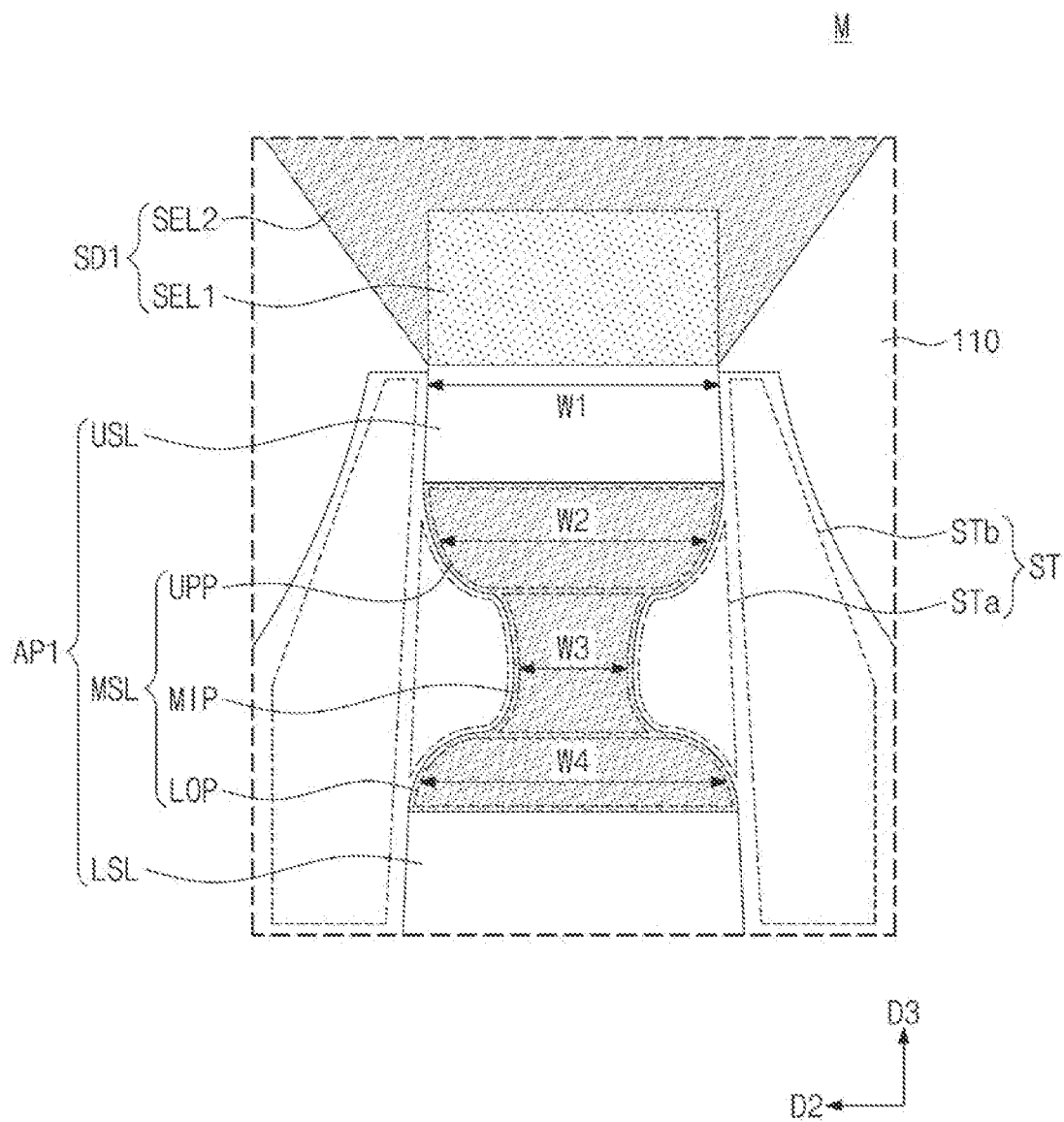
FIG. 6 illustrates an enlarged cross-sectional view showing section M of FIG. 5C.
Figure 7A:
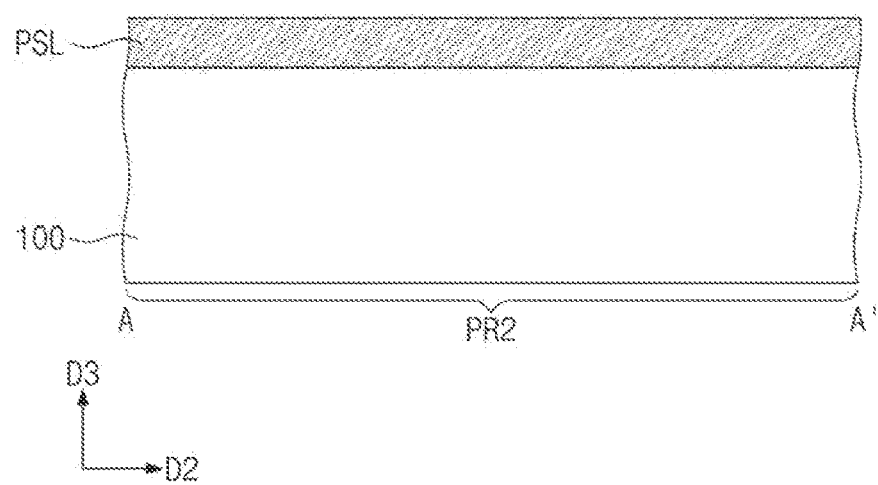
FIGS. 7A to 16D illustrate cross-sectional views showing a method of fabricating a semiconductor device, according to example embodiments of the present inventive concepts.
Figure 7B:
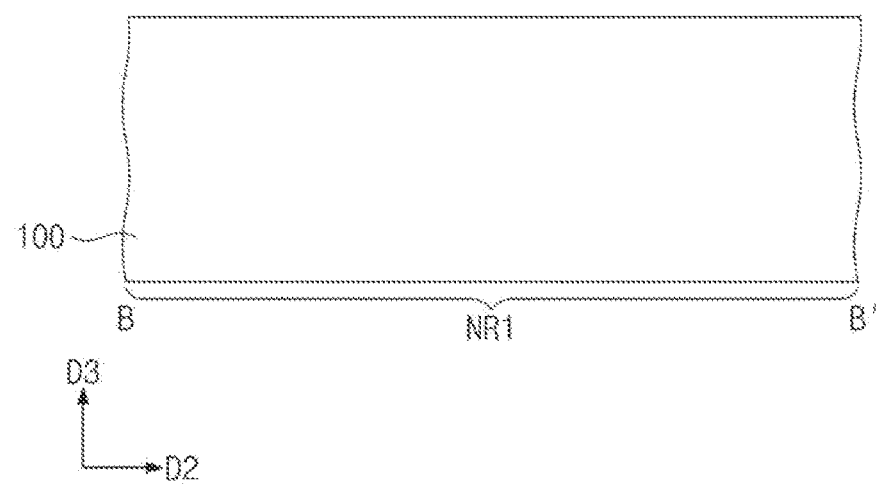
Figure 7C:
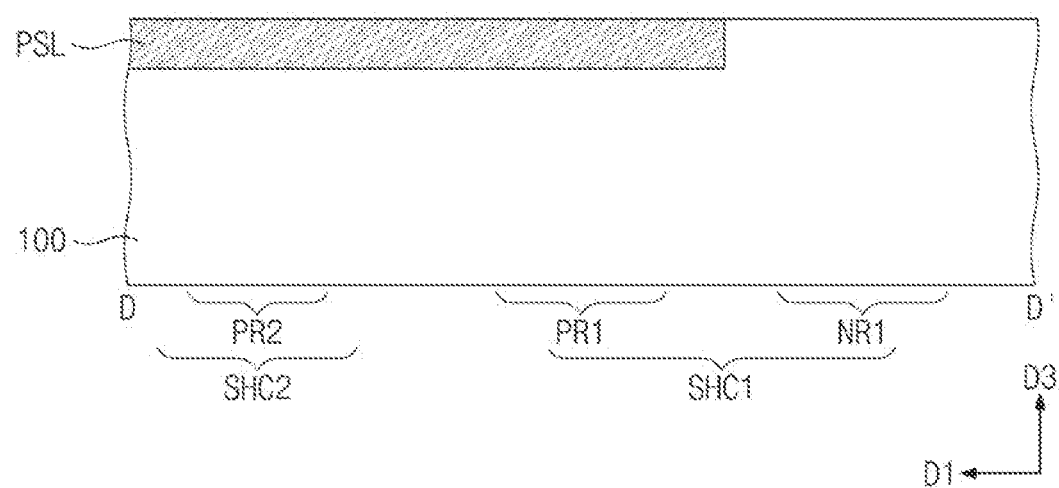

In some embodiments of the present inventive concepts, referring to FIGS. 5A and 5C, the active contact AC may have an upper portion adjacent to the gate contact GC, and the upper portion of the active contact AC may be filled with an upper dielectric pattern UIP. The upper dielectric pattern UIP may have a bottom surface lower than that of the gate contact GC. For example, the upper dielectric pattern UIP may cause the active contact AC adjacent to the gate contact GC to have a top surface lower than the bottom surface of the gate contact GC. Therefore, it may be possible to prevent a short circuit resulting from contact between the gate contact GC and its adjacent active contact AC.

Each of the active contact AC and the gate contact GC may include a conductive pattern FM and a barrier pattern BM that surrounds the conductive pattern FM. For example, the conductive pattern FM may include at least one metal selected from aluminum, copper, tungsten, molybdenum, and cobalt. The barrier pattern BM may cover sidewalls and a bottom surface of the conductive pattern FM. The barrier pattern BM may include a metal layer and a metal nitride layer. The metal layer may include at least one selected from titanium, tantalum, tungsten, nickel, cobalt, and platinum. The metal nitride layer may include at least one selected from a titanium nitride (TiN) layer, a tantalum nitride (TaN) layer, a tungsten nitride (WN) layer, a nickel nitride (NiN) layer, a cobalt nitride (CoN) layer, and a platinum nitride (PtN) layer.

A first metal layer M1 may be provided in the third interlayer dielectric layer 130. For example, the first metal layer M1 may include a first power line M1_R1, a second power line M1_R2, a third power line M1_R3, and first wiring lines M1_I. The lines M1_R1, M1_R2, M1_R3, and M1_I of the first metal layer M1 may extend in parallel in the second direction D2.

For example, the first and second power lines M1_R1 and M1_R2 may be correspondingly provided on the third and fourth boundaries BD3 and BD4 of the first single height cell SHC1. The first power line M1_R1 may extend in the second direction D2 along the third boundary BD3. The second power line M1_R2 may extend in the second direction D2 along the fourth boundary BD4.

The first wiring lines M1_I of the first metal layer M1 may be arranged at a second pitch along the first direction D1. The second pitch may be less than the first pitch. Each of the first wiring lines M1_I may have a line-width less than that of each of the first, second, and third power lines M1_R1, M1_R2, and M1_R3.

The first metal layer M1 may further include first vias VI1. The first vias VI1 may be correspondingly provided below the lines M1_R1, M1_R2, M1_R3, and M1_I of the first metal layer M1. The first via VI1 may electrically connect the active contact AC to one of the lines M1_R1, M1_R2, M1_R3, and M1_I of the first metal layer M1. The first via VI1 may electrically connect the gate contact GC to one of the lines M1_R1, M1_R2, M1_R3, and M1_I of the first metal layer M1.

A wiring line and its underlying first via VI1 of the first metal layer M1 may be formed by individual processes. For example, a wiring line and its underlying first via VI1 of the first metal layer M1 may each be formed by a single damascene process. A sub-20 nm process may be employed to fabricate a semiconductor device according to some embodiments.

A second metal layer M2 may be provided in a fourth interlayer dielectric layer 140. The second metal layer M2 may include a plurality of second wiring lines M2_I. The second wiring lines M2_I of the second metal layer M2 may each have a linear or bar shape that extends in the first direction D1. For example, the second wiring lines M2_I may parallel extend in the first direction D1.

The second metal layer M2 may further include second vias VI2 correspondingly provided below the second wiring lines M2_I. A wiring line of the first metal layer M1 may be electrically connected through the second via VI2 to a corresponding wiring line of the second metal layer M2. A wiring line and its underlying second via VI2 of the second metal layer M2 may be simultaneously formed by a dual damascene process.

The first and second metal layers M1 and M2 may have their wiring lines that include the same or different conductive materials. For example, a wiring line of the first metal layer M1 and a wiring line of the second metal layer M2 may include at least one metallic material selected from aluminum, copper, tungsten, molybdenum, ruthenium, and cobalt. Although not shown, other metal layers (e.g., M3, M4, M5, etc.) may be additionally stacked on the fourth interlayer dielectric layer 140. Each of the stacked metal layers may include wiring lines for routing between cells and vias underlying the wiring lines.

With reference to FIG. 6, the following will describe in detail the first active pattern AP1. Referring to FIG. 6, the first active pattern AP1 may include a lower semiconductor layer LSL, a middle semiconductor layer MSL, and an upper semiconductor layer USL that are sequentially stacked. The lower semiconductor layer LSL may be a portion of the substrate 100. For example, the lower semiconductor layer LSL may include silicon.

The middle semiconductor layer MSL may be provided on the lower semiconductor layer LSL. The upper semiconductor layer USL may separate the middle semiconductor layer MSL from the first source/drain pattern SD1. The middle semiconductor layer MSL may include silicon-germanium. The middle semiconductor layer MSL may have a germanium concentration greater than that of the first source/drain pattern SD1. For example, the middle semiconductor layer MSL may have a germanium concentration of about 60 at % to about 65 at %. The upper semiconductor layer USL may be provided on the middle semiconductor layer MSL. The upper semiconductor pattern USP may include the same material as that of the lower semiconductor pattern LSP. For example, the upper semiconductor layer USL may include silicon. The upper semiconductor layer USL may be in contact with the first source/drain pattern SD1. The term "contact," as used herein, refers to a direct connection (i.e., touching) unless the context indicates otherwise. A first width W1 may be given as a minimum width of the upper semiconductor layer USL. The first width W1 may be a width at an uppermost surface of the upper semiconductor layer USL.

The middle semiconductor layer MSL may include an upper portion UPP adjacent to the upper semiconductor layer USL, a lower portion LOP adjacent to the lower semiconductor layer LSL, and a middle portion MIP between the upper portion UPP and the lower portion LOP. The middle portion MIP may connect the upper portion UPP to the lower portion LOP. A second width W2 may be given as a width of the upper portion UPP. A third width W3 may be given as a width of the middle portion MIP. A fourth width W4 may be given as a width of the lower portion LOP. The second width W2 may gradually decrease in a downward direction. The third width W3 may gradually decrease in a downward direction to a minimum value and then progressively increase in the downward direction. The fourth width W4 may gradually increase in a downward direction. Consequently, the middle semiconductor layer MSL may have a width that gradually decreases in a downward direction to a minimum value and then progressively increases in the downward direction. For example, the middle semiconductor layer MSL may have a bottleneck structure. The second width W2 may be greater than the third width W3. The fourth width W4 may be greater than the third width W3. For example, minimum values of the second width W2 and the fourth width W4 may be greater than a minimum value of the third width W3. A width at a top surface of the upper portion UPP and a width at a bottom surface of the lower portion LOP may each be greater than that of the middle portion MIP. For example, a maximum value of each of the second and fourth widths W2 and W4 may be greater than the third width W3.

A minimum value of the third width W3 may be about ⅓ to ½ of the first width W1. For example, a minimum width of the middle semiconductor layer MSL may be about ⅓ to ½ of a minimum width of the upper semiconductor layer USL.

On the second single height cell SHC2, a portion of the middle semiconductor layer MSL may vertically overlap the first source/drain pattern SD1. On the first single height cell SHC1, the middle semiconductor layer MSL may be offset from the first source/drain pattern SD1 (see FIGS. 5C and 5D). Referring back to FIG. 5C, the middle semiconductor layer MSL may have a bottom surface located at a fourth level LV4. The fourth level LV4 may be substantially the same as or higher than the second level LV2. For example, on the first active pattern AP1 including a plurality of active fins, the middle semiconductor layer MSL may not vertically overlap the first source/drain pattern SD1, and on the first active pattern AP1 including one active fin, a portion of the middle semiconductor layer MSL may vertically overlap the first source/drain pattern SD1. Therefore, the middle semiconductor layer MSL may be selectively formed based on characteristics of a transistor in a semiconductor device. As illustrated in figures, on a region with a plurality of active fins, the middle semiconductor layer MSL may not remain below the first source/drain pattern SD1, and on a region with one active fin, the middle semiconductor layer MSL may remain below the first source/drain pattern SD1.

The device isolation layer ST may include a first portion STa adjacent to the middle semiconductor layer MSL and a second portion STb spaced apart from the middle semiconductor layer MSL by the first portion STa. The device isolation layer ST may have a germanium concentration that decreases with increasing distance from the middle semiconductor layer MSL. The first portion STa of the device isolation layer ST may include silicon-germanium oxide (SiGeO). The second portion STb of the device isolation layer ST may not include germanium, but may include silicon oxide (SiO). The first portion STa of the device isolation layer ST may have a germanium concentration greater than that of the second portion STb of the device isolation layer ST.

According to some embodiments of the present inventive concepts, the middle semiconductor layer MSL may be formed to have a bottleneck structure. A typical silicon (Si) fin may be difficult to achieve a bottleneck structure. As discussed below, regarding the middle semiconductor layer MSL including silicon-germanium, it may be easy to accomplish a bottleneck structure by using a difference in germanium diffusion rate through an annealing process. The bottleneck-structured middle semiconductor layer MSL may cause the first active pattern AP1 to have a reduced width, and thus the gate electrode GE may have an increased capability of channel control. Accordingly, it may be possible to improve a short channel effect occurring due to a reduction in size of a semiconductor device.

In addition, as the bottleneck structure is formed by performing an annealing process on the middle semiconductor layer MSL, the middle semiconductor layer MSL may increase in germanium concentration. Therefore, it may be possible to increase magnitude of compressive stress applied to the first channel pattern CH1. Accordingly, there may be an increase in charge mobility in channel regions of transistors, and in turn, the transistor may increase in operating speed. In conclusion, a semiconductor device may increase in electrical properties.

A structure of the middle semiconductor layer MSL discussed with reference to FIG. 6 may be substantially the same as that of the middle semiconductor layer MSL on the first single height cell SHC1. Although FIGS. 1 to 6 show the embodiment in which the middle semiconductor layer MSL is included in a logic cell, a structure of the first active pattern AP1 including the middle semiconductor layer MSL may also be applicable to a semiconductor memory device such as SRAM.

FIGS. 7A to 16D illustrate cross-sectional views showing a method of fabricating a semiconductor device according to example embodiments of the present inventive concepts. FIGS. 7A, 8A, 9A, 10A, 11A, 12A, 13A, 14A, 15A, and 16A show cross-sectional views taken along line A-A' of FIG. 4. FIGS. 7B, 8B, 12B, 13B, 14B, 15B, and 16B depict cross-sectional views taken along line B-B' of FIG. 4. FIGS. 12C, 13C, 14C, 15C, and 16C show cross-sectional views taken along line C-C' of FIG. 4. FIGS. 7C, 8C, 9B, 10B, 11B, 12D, 13D, 14D, 15D, and 16D show cross-sectional views taken along line D-D' of FIG. 4.

Referring to FIGS. 4 and 7A to 7C, a substrate 100 may be provided which includes first and second PMOSFET region PR1 and PR2 and first and second NMOSFET regions NR1 and NR2. For example, the substrate 100 may be a silicon substrate.

A preliminary semiconductor layer PSL may be formed on the substrate 100. For example, the formation of the preliminary semiconductor layer PSL may include forming a mask on the first and second NMOSFET regions NR1 and NR2, using the mask as an etching mask to etch a portion of the substrate 100 on the first and second PMOSFET regions PR1 and PR2, and forming the preliminary semiconductor layer PSL on the first and second PMOSFET regions PR1 and PR2. The preliminary semiconductor layer PSL may include silicon-germanium (SiGe). The preliminary semiconductor layer PSL may have a germanium concentration of about 40 at % to about 45 at %.

Figure 8A:
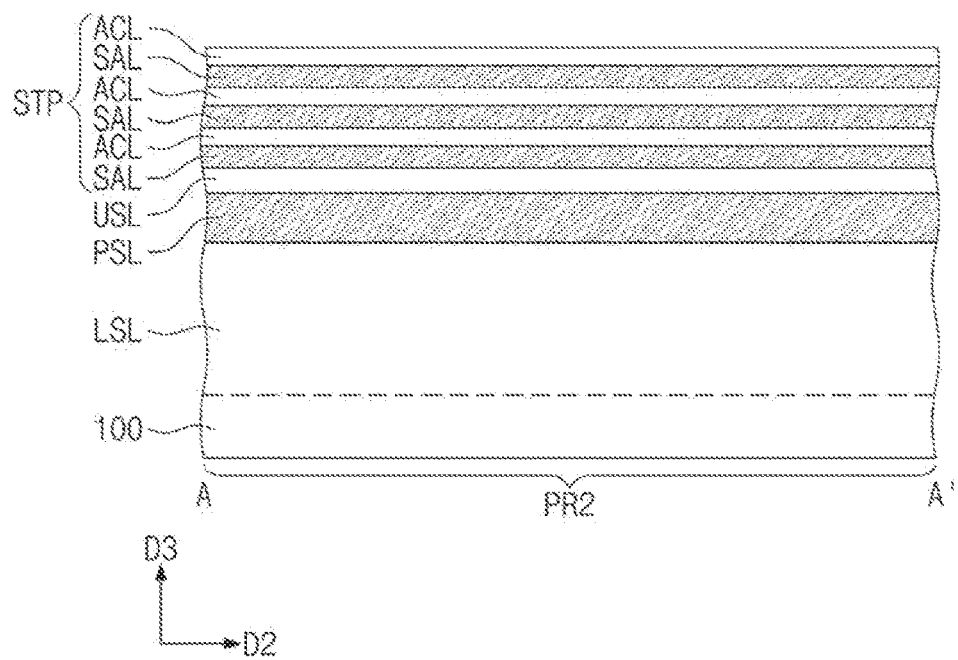
Figure 8B:
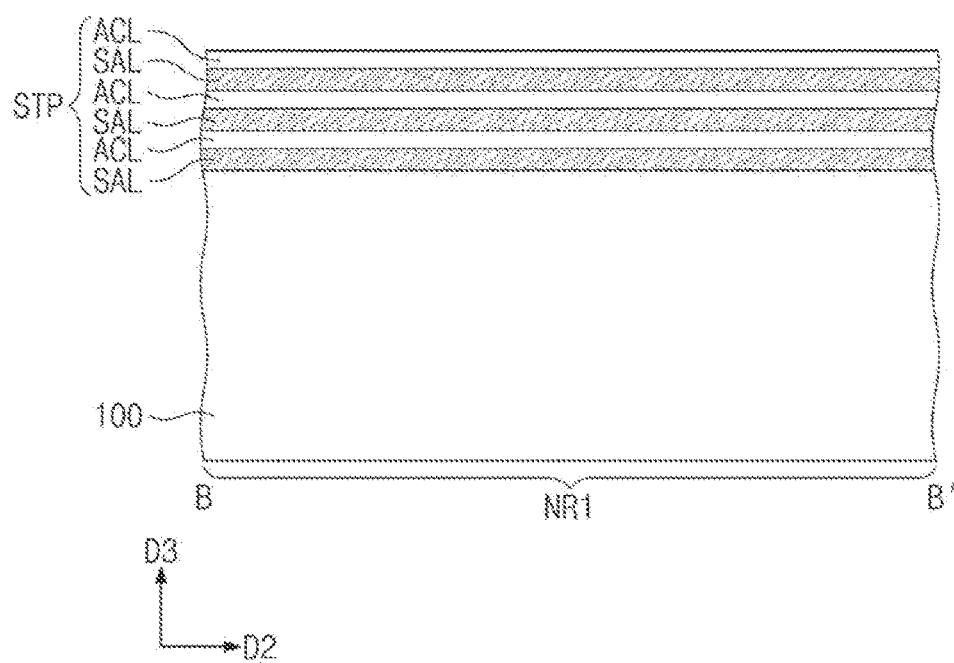
Figure 8C:
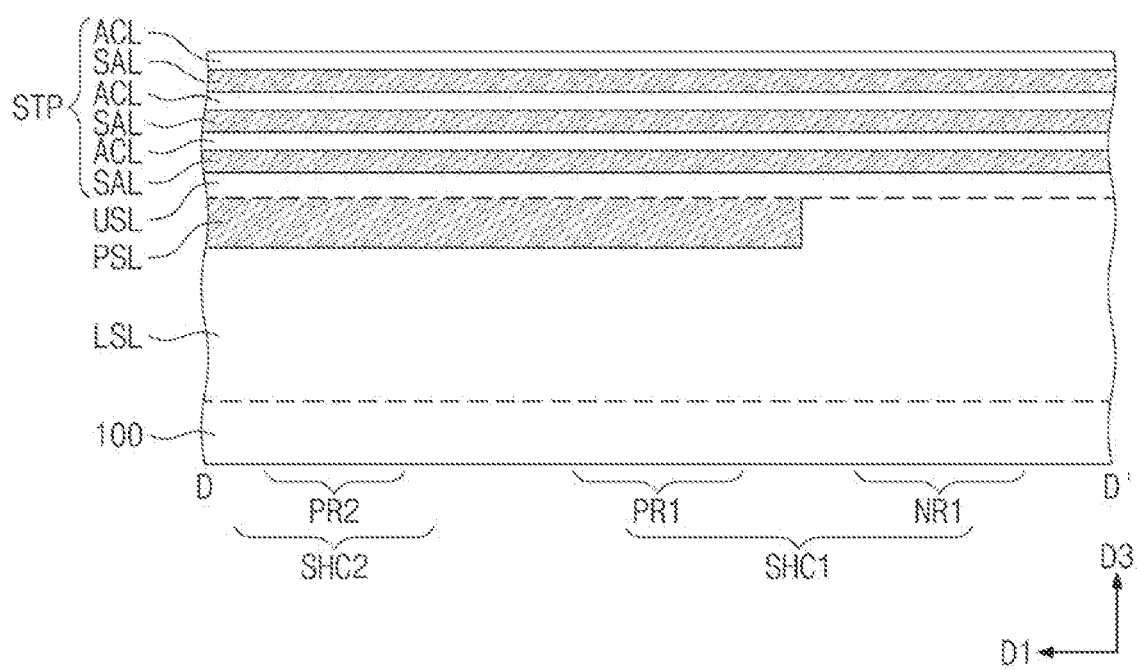

Referring to FIGS. 8A to 8C, an upper semiconductor layer USL may be formed on the preliminary semiconductor layer PSL. For example, the upper semiconductor layer USL may include silicon. The substrate 100 may include a lower semiconductor layer LSL at a portion of the substrate 100 below the preliminary semiconductor layer PSL, and may also include the upper semiconductor layer USL at a portion of the substrate 100 above the preliminary semiconductor layer PSL.

Active layers ACL and sacrificial layers SAL may be formed alternately and stacked on the substrate 100. The active layers ACL may include one of silicon (Si), germanium (Ge), and silicon-germanium (SiGe), and the sacrificial layers SAL may include another of silicon (Si), germanium (Ge), and silicon-germanium (SiGe).

The sacrificial layer SAL may include a material having an etch selectivity with respect to the active layer ACL. For example, the active layers ACL may include silicon (Si), and the sacrificial layers SAL may include silicon-germanium (SiGe). Each of the sacrificial layers SAL may have a germanium concentration of about 10 at % to about 30 at %. The germanium concentration of each of the sacrificial layers SAL may be less than that of the preliminary semiconductor layer PSL. This may be designed to prevent a portion of the active layer ACL from being etched due to a diffusion (which is caused by a following described annealing process) of germanium from the sacrificial layer SAL into the active layer ACL in a process for removing the sacrificial layer SAL.

Figure 9A:
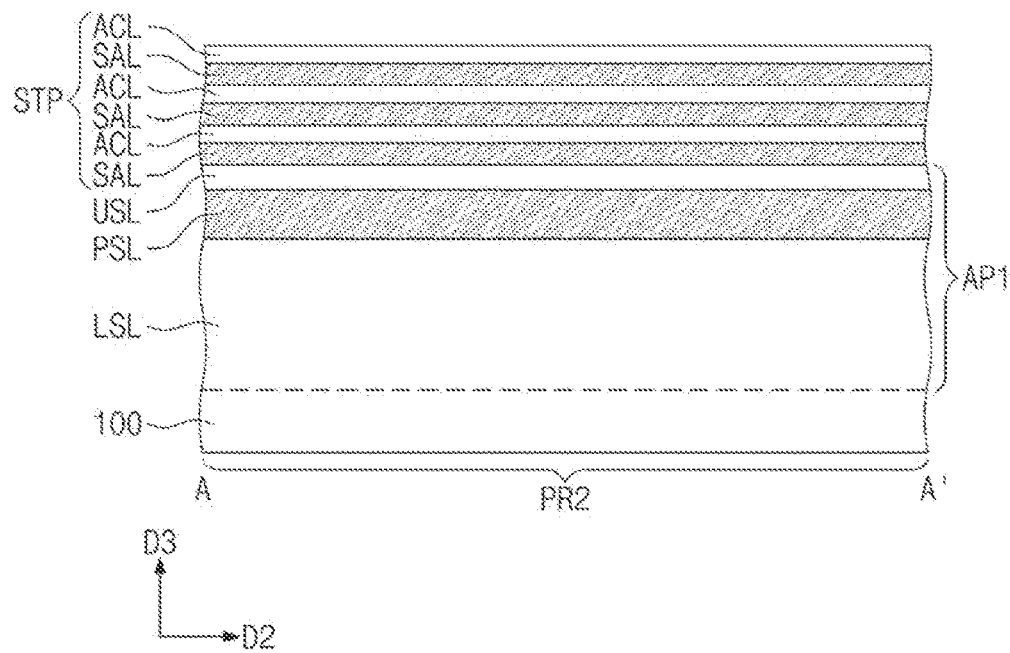
Figure 9B:
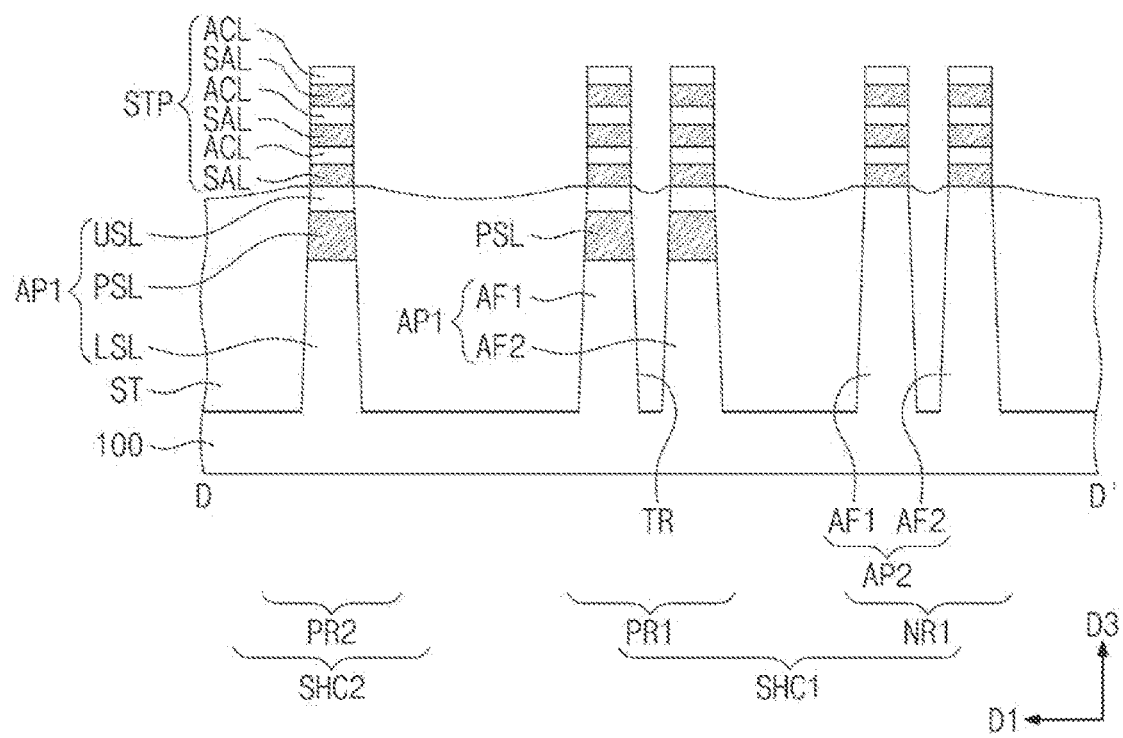

Referring to FIGS. 4, 9A, and 9B, mask patterns may be formed on the first and second PMOSFET regions PR1 and PR2 and the first and second NMOSFET regions NR1 and NR2. The mask patterns may each have a linear or bar shape that extends in a second direction D2. A patterning process may be performed in which the mask patterns are used as an etching mask to form a trench TR that defines a first active pattern AP1 and a second active pattern AP2. The first active pattern AP1 may be formed on each of the first and second PMOSFET regions PR1 and PR2. The second active pattern AP2 may be formed on each of the first and second NMOSFET regions NR1 and NR2. On a first single height cell SHC1, each of the first and second active patterns AP1 and AP2 may include a first active fin AF1 and a second active fin AF2. On a second single height cell SHC2, each of the first and second active patterns AP1 and AP2 may include a single active fin.

A stack pattern STP may be formed on each of the first and second active patterns AP1 and AP2. The stack pattern STP may include the active layers ACL and the sacrificial layers SAL that are alternately stacked. During the patterning process, the stack pattern STP may be formed together with the first and second active patterns AP1 and AP2.

A device isolation layer ST may be formed to fill the trench TR. For example, a dielectric layer may be formed on an entire surface of the substrate 100 to cover the first and second active patterns AP1 and AP2 and the stack patterns STP. The dielectric layer may be recessed until the stack patterns STP are exposed, and thus the device isolation layer ST may be formed.

The device isolation layer ST may include a dielectric material, such as silicon oxide. The stack patterns STP may be exposed upwardly from the device isolation layer ST. For example, the stack patterns STP may vertically and upwardly protrude from the device isolation layer ST.

Figure 10A:
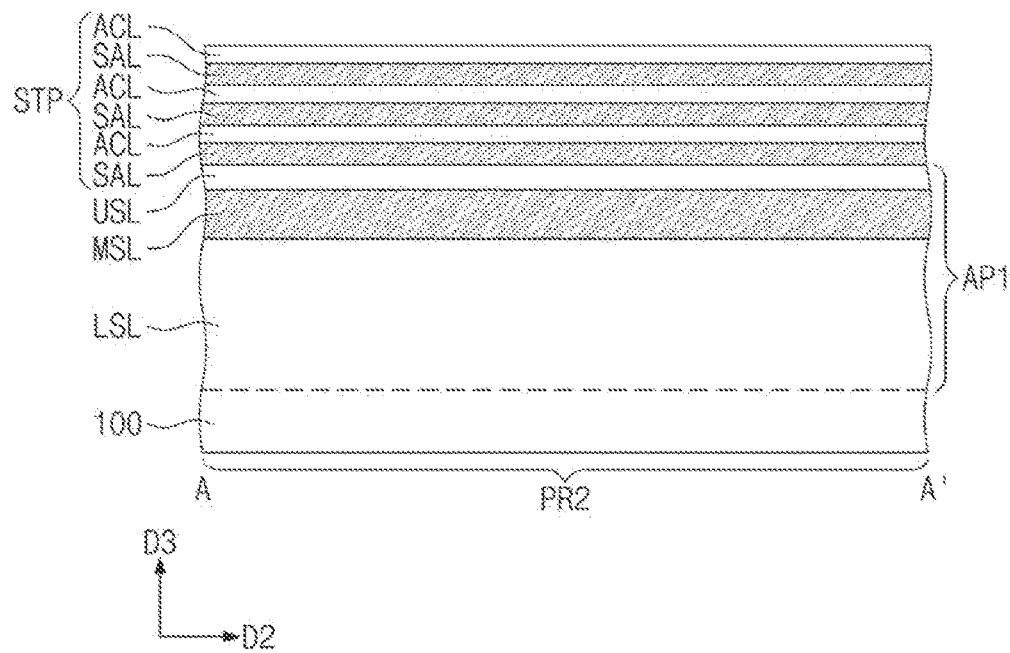
Figure 10B:
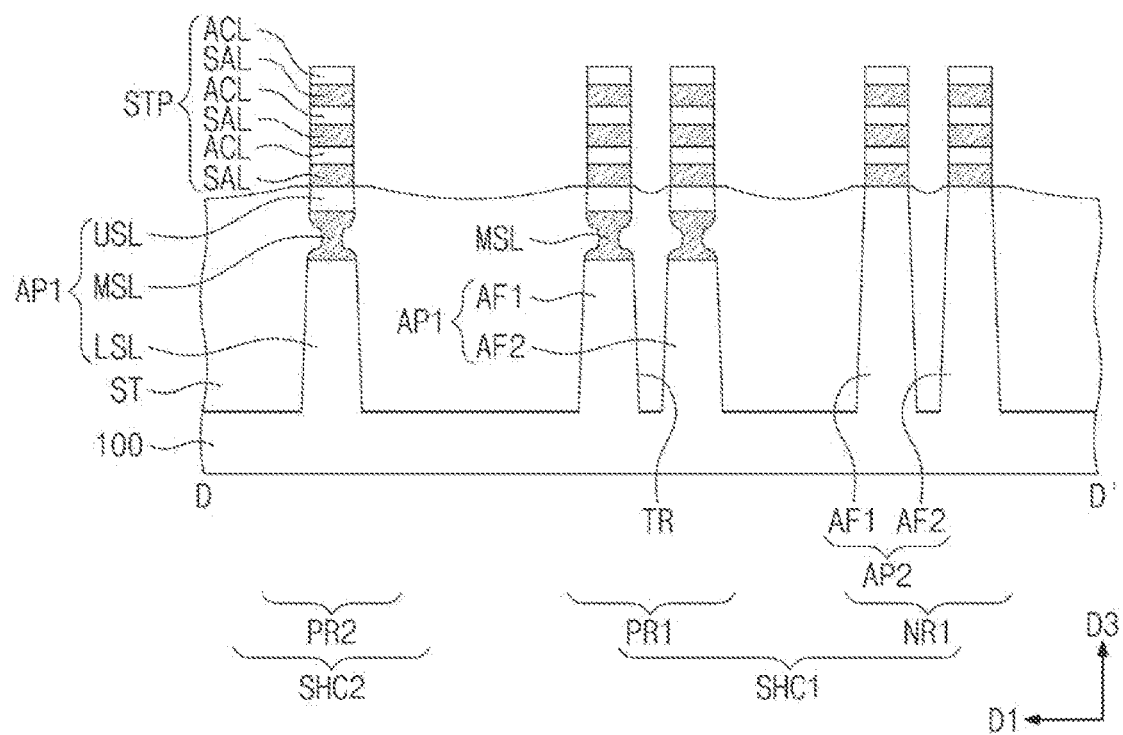

Referring to FIGS. 4, 10A, and 10B, the preliminary semiconductor layer PSL may undergo an annealing process to form a middle semiconductor layer MSL. In the annealing process, germanium atoms may diffuse from the preliminary semiconductor layer PSL of FIG. 9B. For example, the device isolation layer ST may be provided with portions of germanium atoms diffused from the preliminary semiconductor layer PSL of FIG. 9B, and the portions of germanium atoms may react with silicon and oxygen atoms included in the device isolation layer ST. Therefore, silicon-germanium oxide (SiGeO) may be formed to constitute a first portion STa of the device isolation layer ST discussed with reference to FIG. 6. Other portions of germanium atoms, which are included in the preliminary semiconductor layer PSL of FIG. 9B, may diffuse toward a central part of the preliminary semiconductor layer PSL and may be accumulated on the central part of the preliminary semiconductor layer PSL. Accordingly, there may be formed a middle semiconductor layer MSL having a bottleneck structure as discussed with reference to FIG. 6. This may be caused by the fact that a diffusion rate of germanium atoms may be greater in silicon germanium than in silicon oxide included in the device isolation layer ST. Therefore, the middle semiconductor layer MSL of FIG. 10B may have a germanium concentration greater than that of the preliminary semiconductor layer PSL of FIG. 9B. For example, the middle semiconductor layer MSL may have a germanium concentration of about 60 at % to about 65 at %.

A typical silicon (Si) fin may be difficult to achieve a bottleneck structure discussed above. According to some embodiments of the present inventive concepts, an annealing process may be employed to form the bottleneck-structured middle semiconductor layer MSL including silicon-germanium. Accordingly, a gate electrode may have an increased capability of channel control, and a short channel effect may be improved.

Figure 11A:
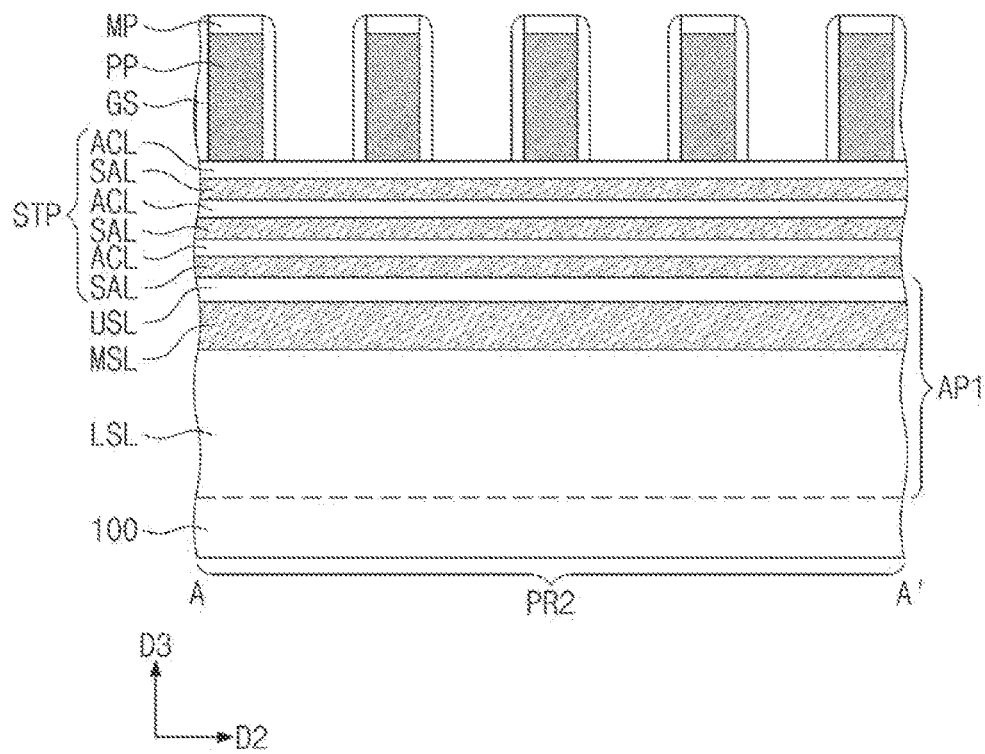
Figure 11B:
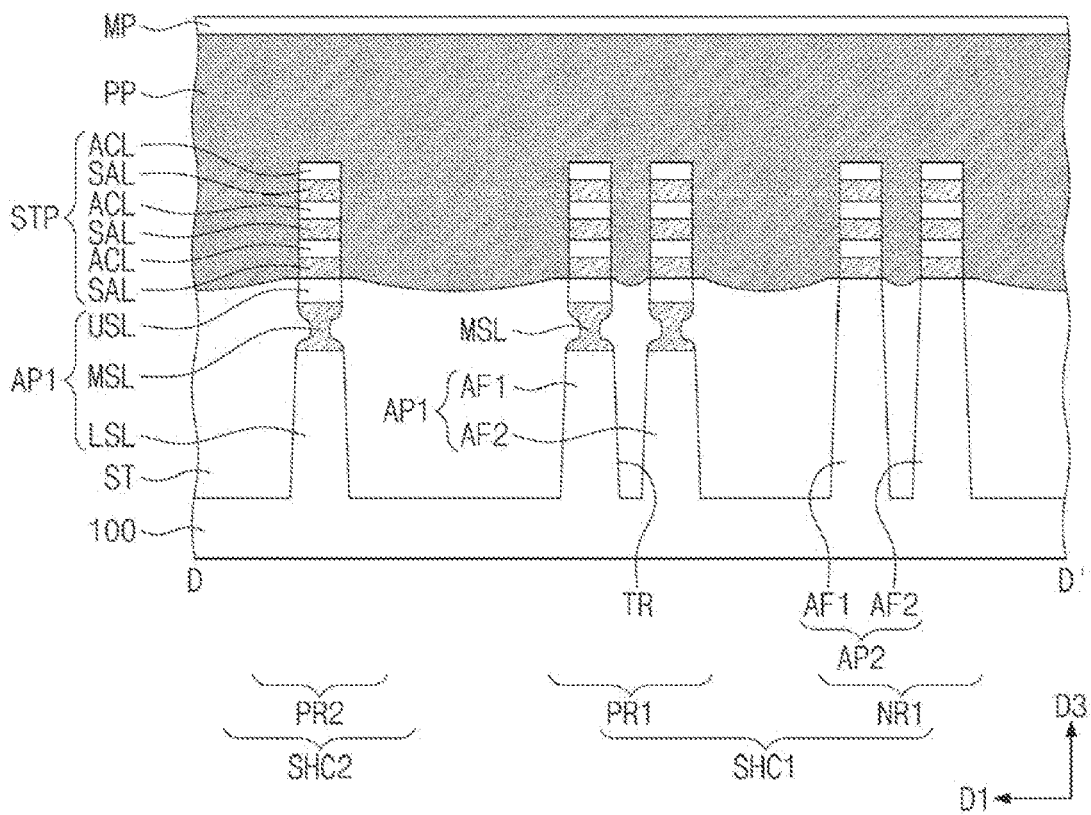
Figure 12A:
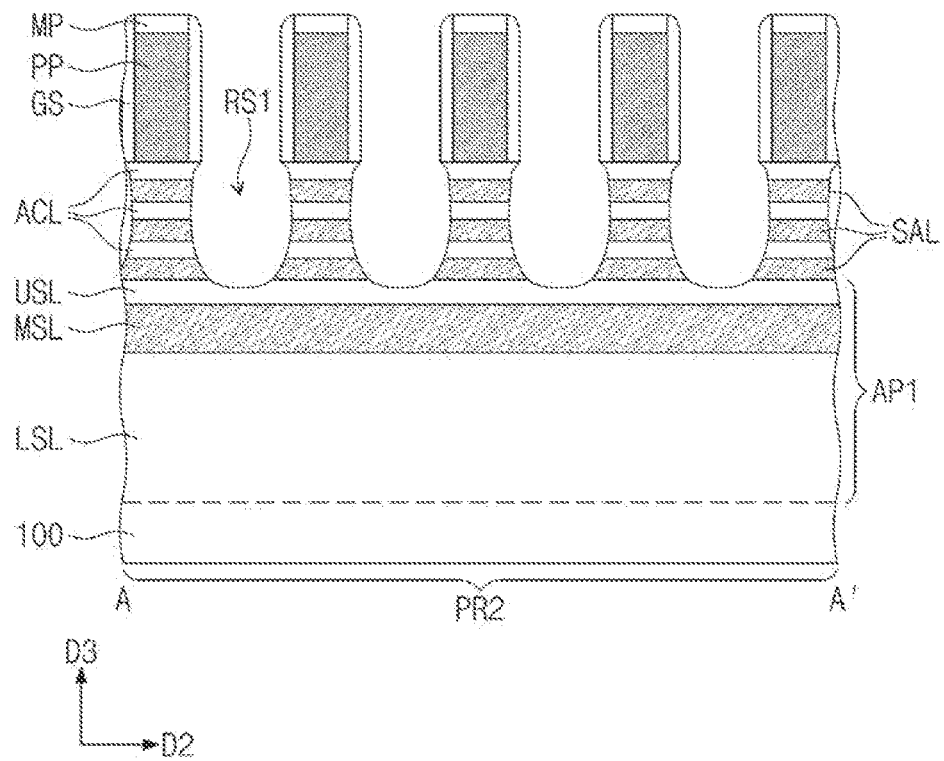
Figure 12B:
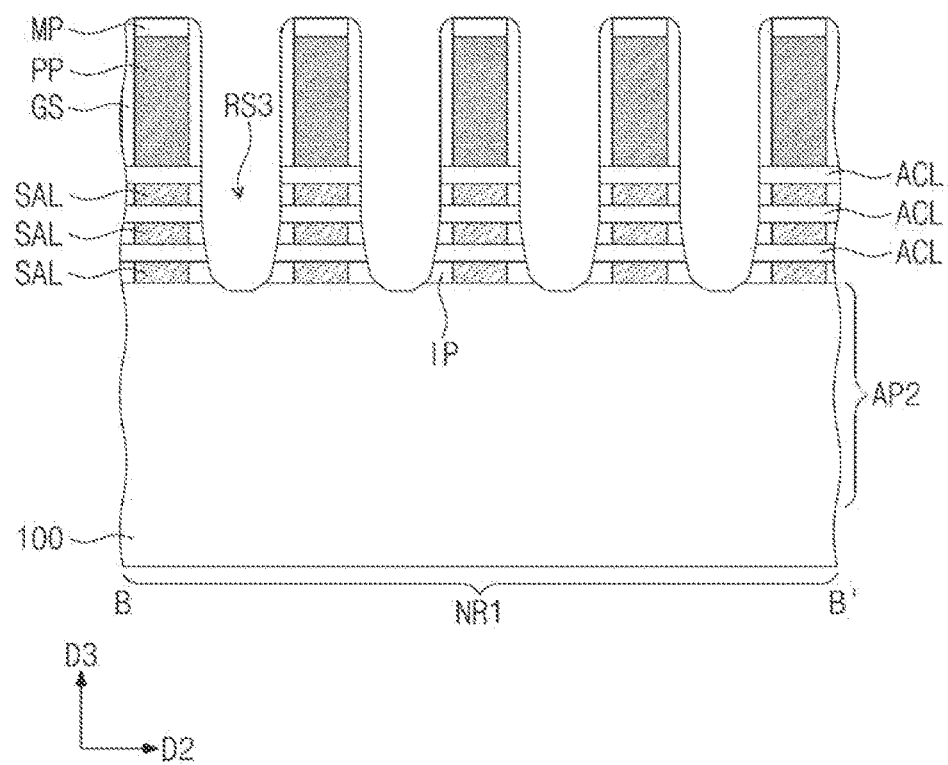
Figure 12C:
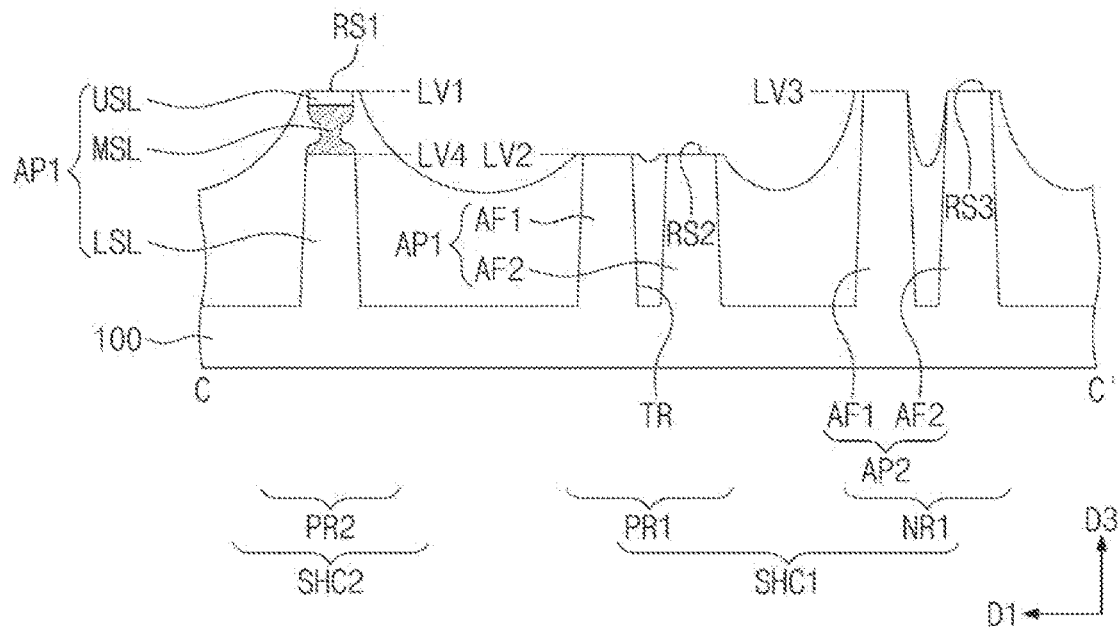
Figure 12D:
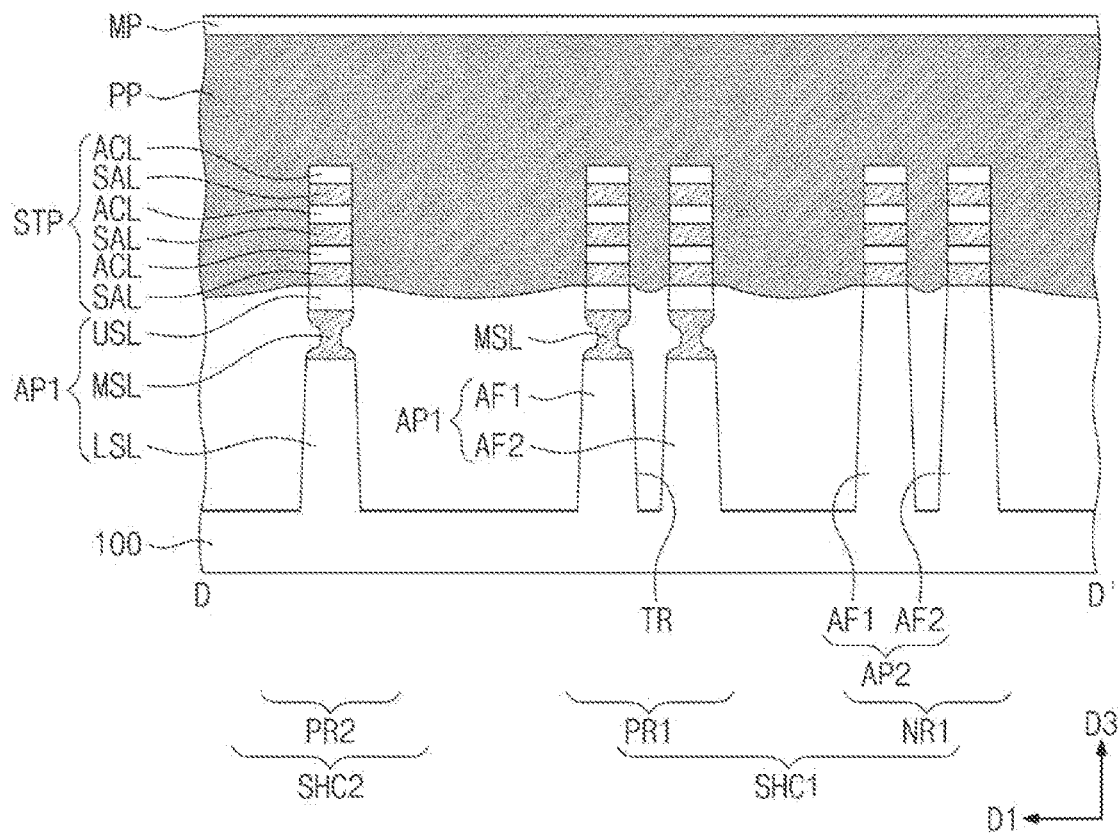
Figure 13A:
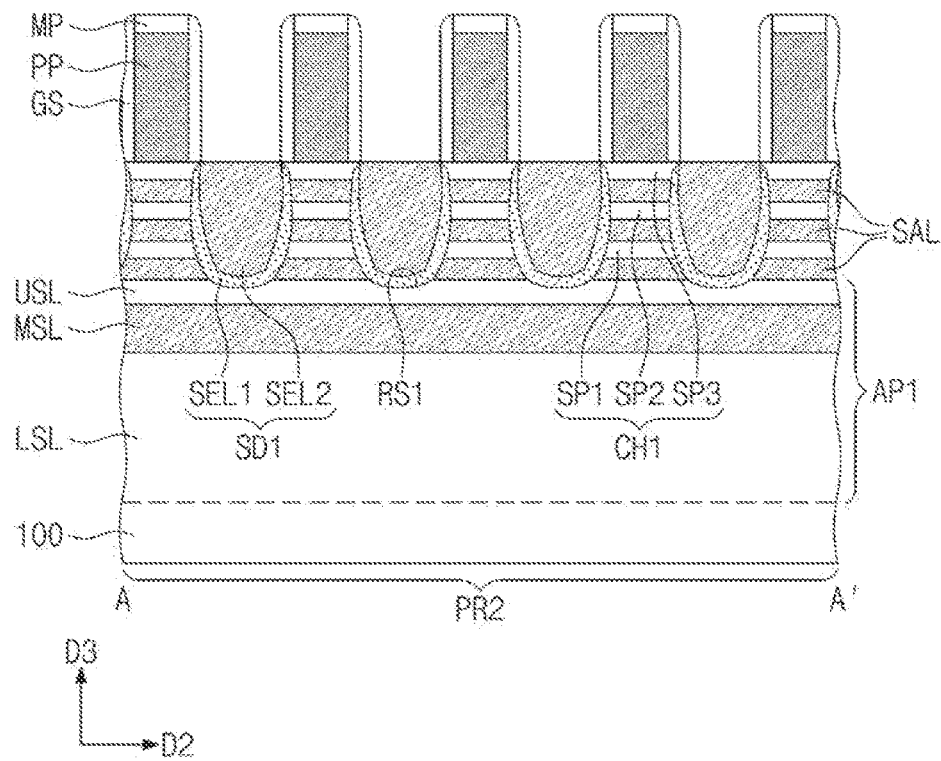
Figure 13B:
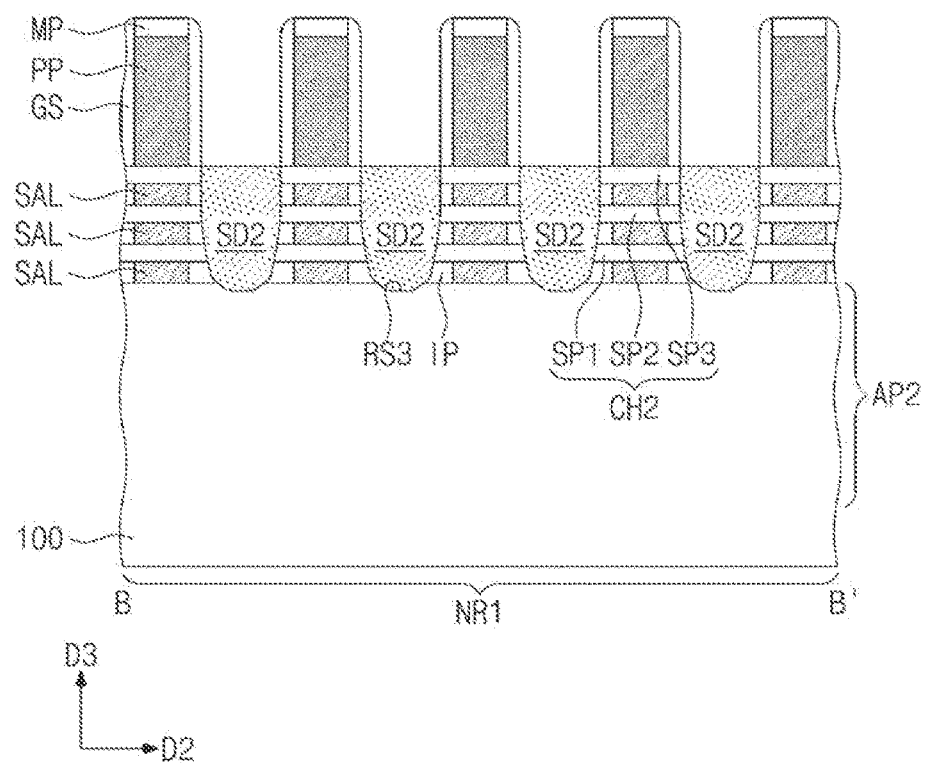
Figure 13C:
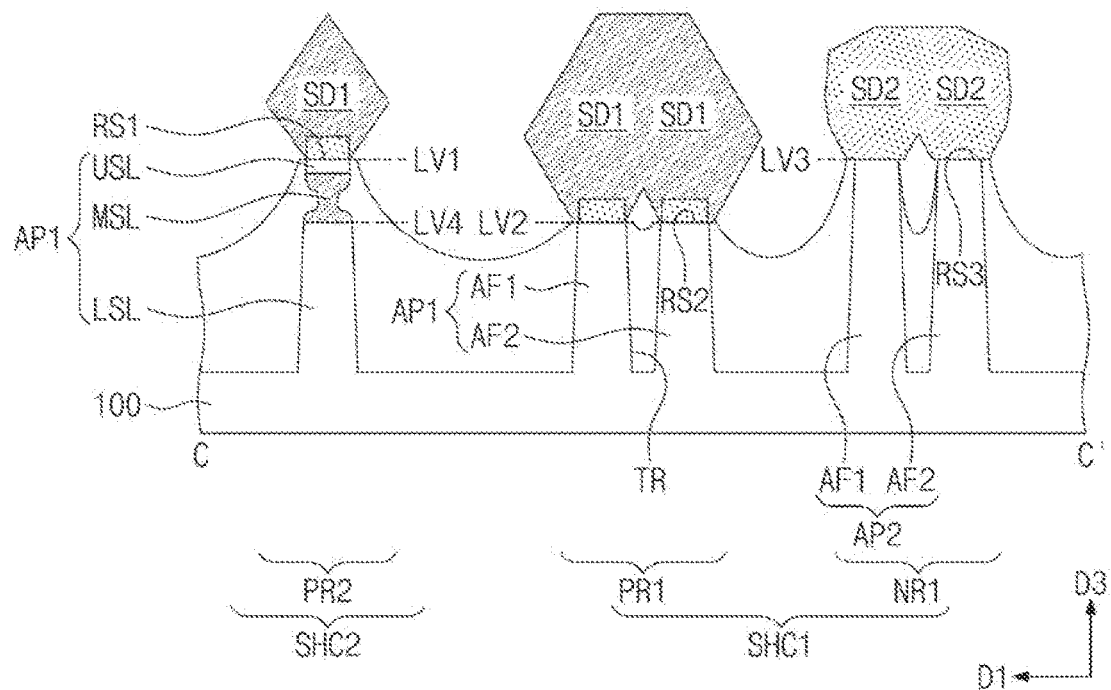
Figure 13D:
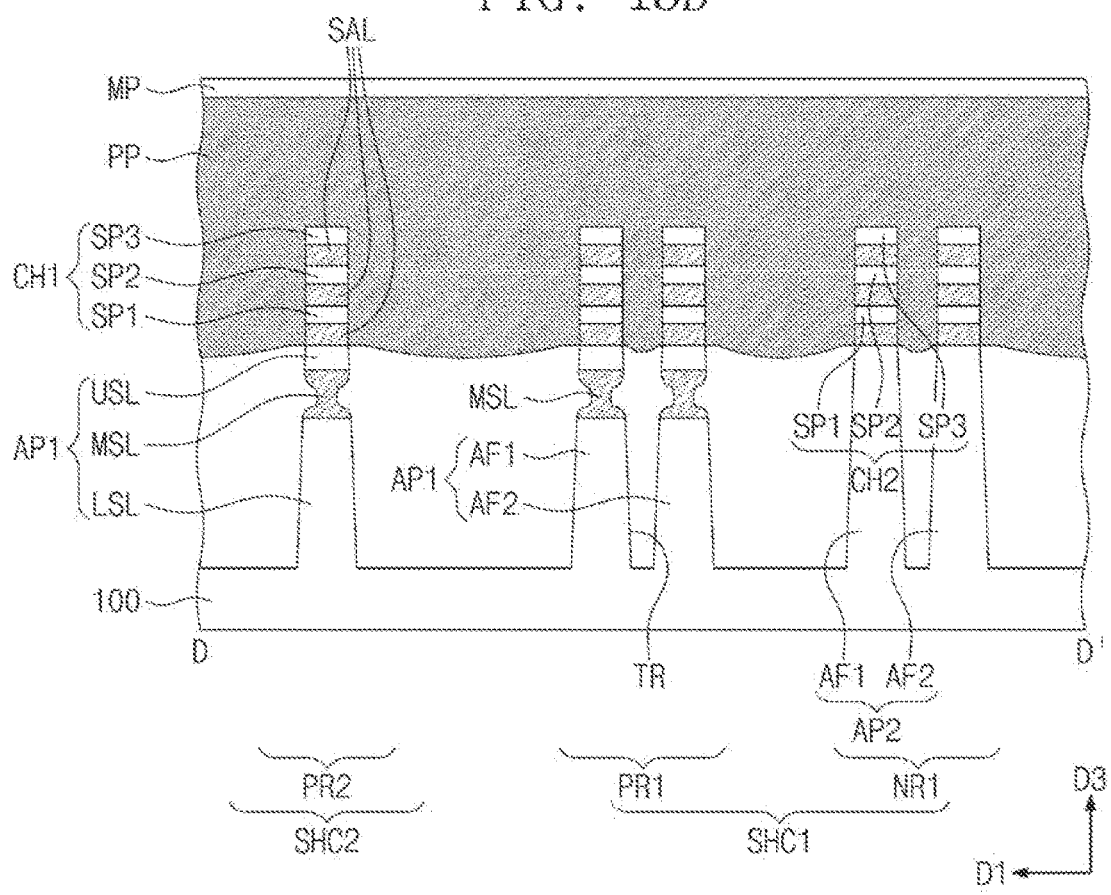
Figure 14A:
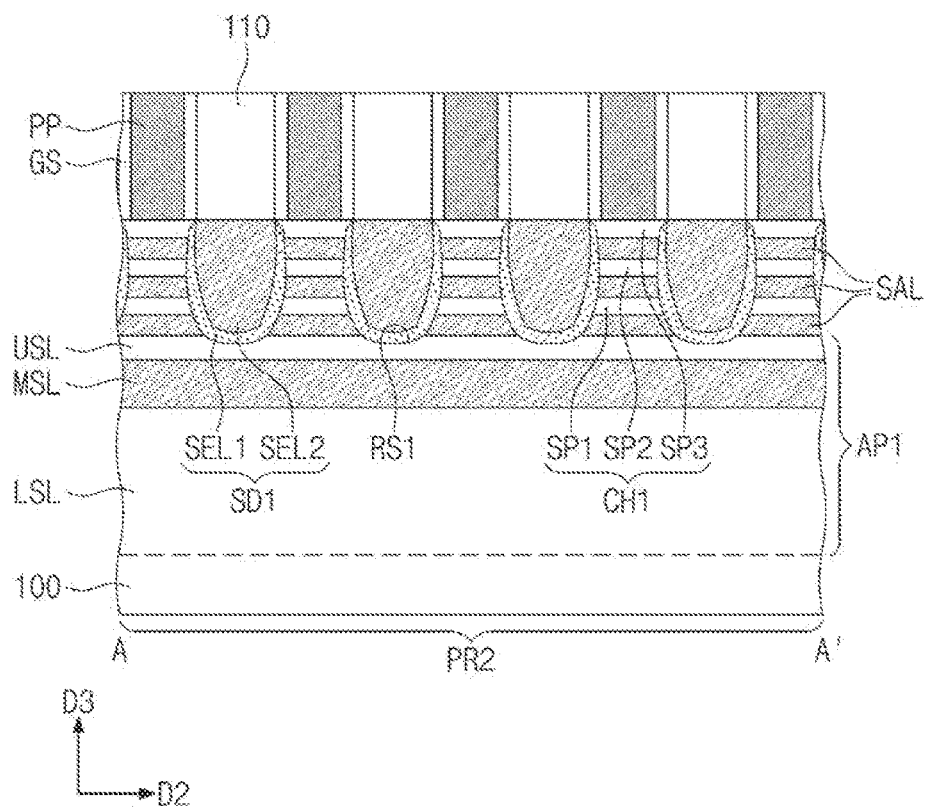
Figure 14B:
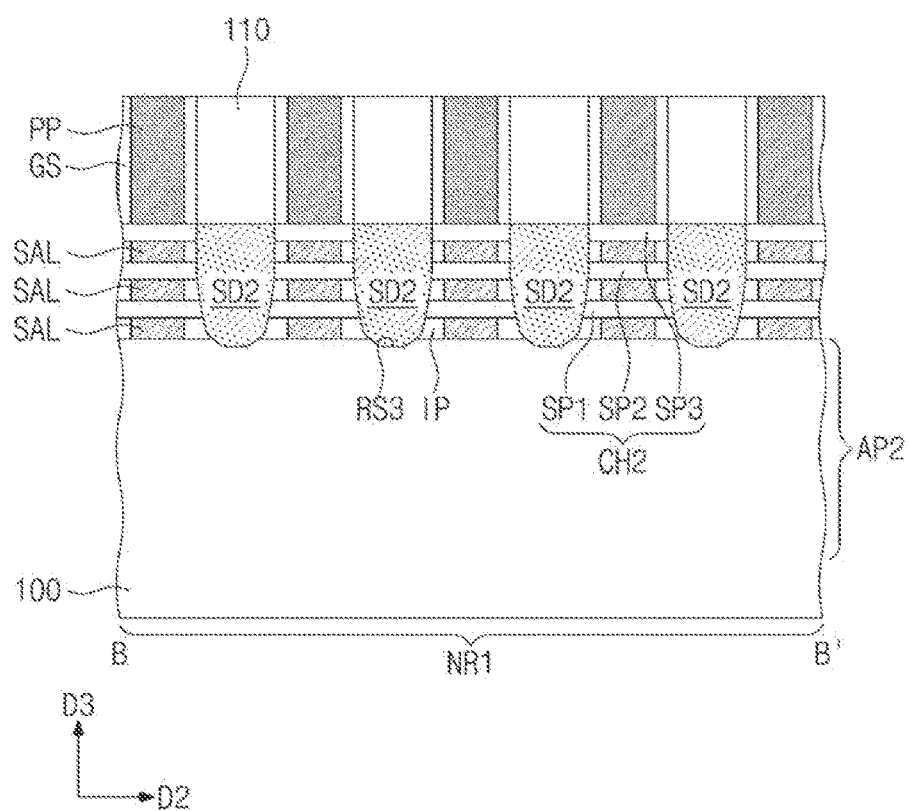
Figure 14C:
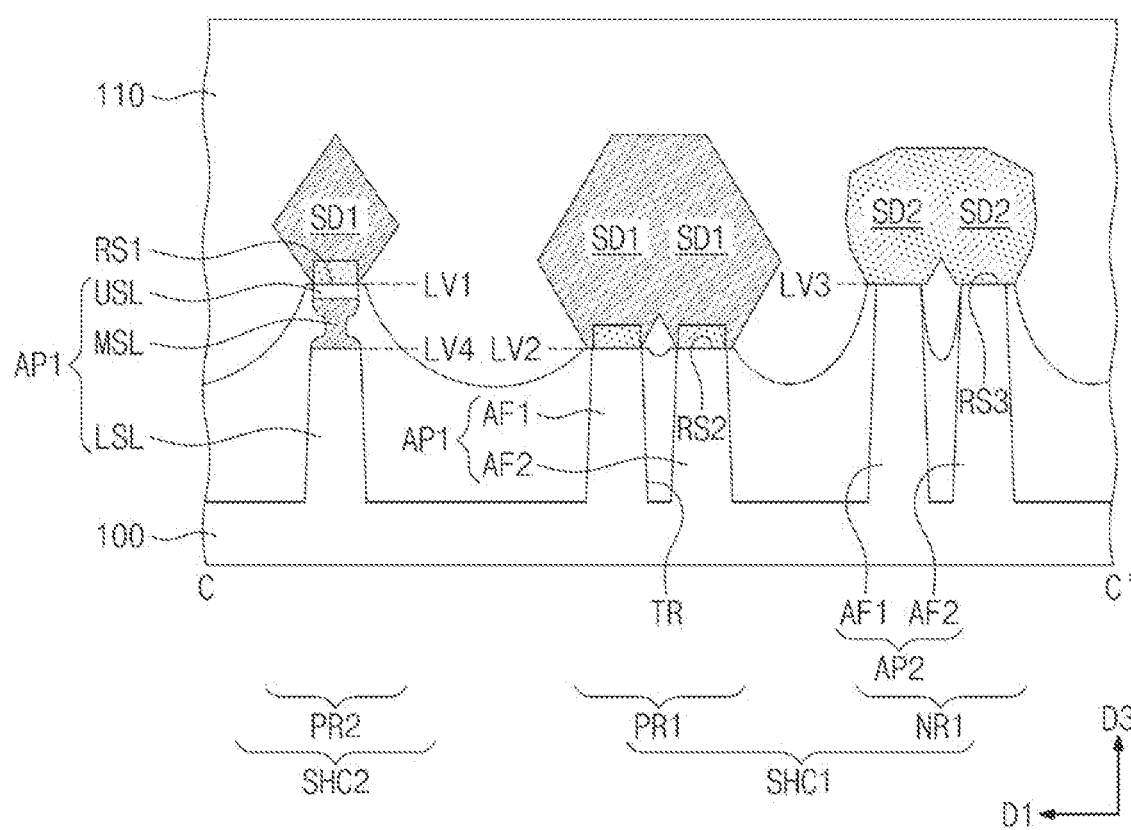
Figure 14D:
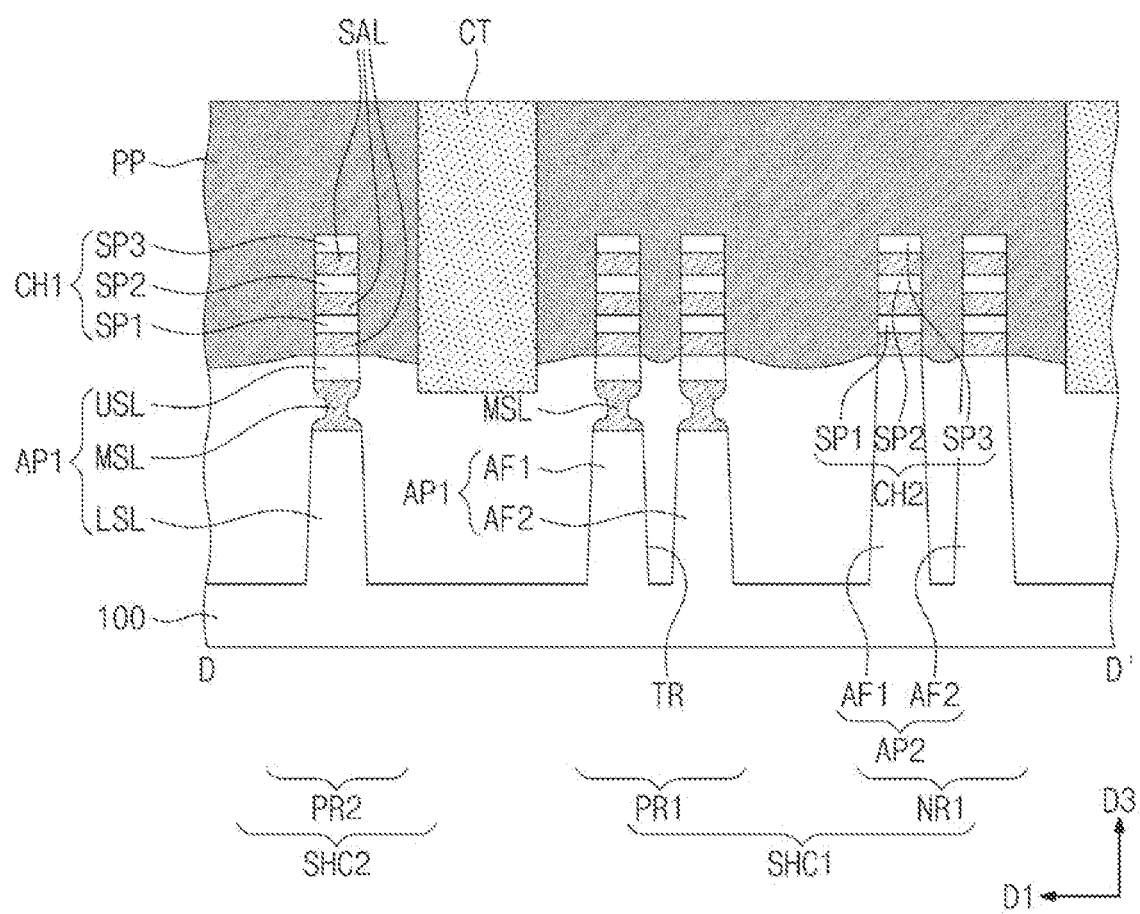

Referring to FIGS. 4, 11A, and 11B, sacrificial patterns PP may be formed on the substrate 100 to run across the stack patterns STP. Each of the sacrificial patterns PP may be formed to have a linear or bar shape that extends in a first direction D1. The sacrificial patterns PP may be arranged at a first pitch along the second direction D2.

For example, the formation of the sacrificial patterns PP may include forming a sacrificial layer on the entire surface of the substrate 100, forming hardmask patterns MP on the sacrificial layer, and using the hardmask patterns MP as an etching mask to pattern the sacrificial layer. The sacrificial layer may include polysilicon.

A pair of gate spacers GS may be formed on opposite sidewalls of each of the sacrificial patterns PP. The formation of the gate spacers GS may include conformally forming a gate spacer layer on the entire surface of the substrate 100 and anisotropically etching the gate spacer layer.

Referring to FIGS. 4 and 12A to 12D, first recesses RS1 may be formed in the stack pattern STP on the first active pattern AP1 of the second single height cell SHC2. Second recesses RS2 may be formed in the stack pattern STP on the first active pattern AP1 of the first single height cell SHC1. Third recesses RS3 may be formed in the stack pattern STP on the second active pattern AP2. During the formation of the first, second, and third recesses RS1, RS2, and RS3, the device isolation layer ST may further be recessed on opposite sides of each of the first and second active patterns AP1 and AP2 (see FIG. 12C).

For example, the hardmask patterns MP and the gate spacers GS may be used as an etching mask to etch the stack pattern STP on the first active pattern AP1, which may result in the formation of the first recesses RS1. Each of the first recesses RS1 may be formed between a pair of sacrificial patterns PP. The first recesses RS1 may have a lowermost surface located at a level higher than that of a top surface of the middle semiconductor layer MSL.

The second recesses RS2 may be formed by the same method used for forming the first recesses RS1. However, the formation of the second recesses RS2 may continue until the lower semiconductor layer LSL is exposed after removing the middle semiconductor layer MSL. Thus, the second recesses RS2 may have a lowermost surface located at a level LV2 substantially the same as or lower than a level LV4 of a bottom surface of the middle semiconductor layer MSL. According to some embodiments of the present inventive concepts, depths of the first and second recesses RS1 and RS2 may be adjusted to remove or leave the middle semiconductor layer MSL based on characteristics of a transistor in a semiconductor device.

The first recesses RS1 and the second recesses RS2 may be formed by individual processes. For example, the first recesses RS1 and the second recesses RS2 may not be formed at the same time.

The third recesses RS3 in the stack pattern STP on the second active pattern AP2 may be formed by the same method used for forming the first recesses RS1. The formation of the third recesses RS3 may further include forming an inner spacer IP in a region where the sacrificial layer SAL is recessed. The third recesses RS3 and the first recesses RS1 may be formed by individual processes. For example, the first recesses RS1 and the third recesses RS3 may not be formed at the same time.

Referring to FIGS. 4 and 13A to 13D, first source/drain patterns SD1 may be correspondingly formed in the first recesses RS1 and the second recesses RS2. For example, a first selective epitaxial growth (SEG) process may be performed in which an inner wall of each of the first and second recesses RS1 and RS2 is used as a seed layer to form a first semiconductor layer SEL1.

The active layers ACL may be formed into first, second, and third semiconductor patterns SP1, SP2, and SP3 that are sequentially stacked between neighboring first recesses RS1 and between neighboring second recesses RS2. The active layers ACL may be formed into first, second, and third semiconductor patterns SP1, SP2, and SP3 that are sequentially stacked between neighboring third recessed RS3. A first channel pattern CH1 may be constituted by the first, second, and third semiconductor patterns SP1, SP2, and SP3 between neighboring first recesses RS1 and between neighboring second recesses RS2. A second channel pattern CH2 may be constituted by the first, second, and third semiconductor patterns SP1, SP2, and SP3 between neighboring third recesses RS3.

The first semiconductor layer SELL may be grown from a seed, or the substrate 100 and the first, second, and third semiconductor patterns SP1, SP2, and SP3 exposed to the first recess RS1 and the second recess RS2. For example, the first SEG process may include chemical vapor deposition (CVD) or molecular beam epitaxy (MBE).

The first semiconductor layer SEL1 may include a semiconductor element (e.g., SiGe) whose lattice constant is greater than that of a semiconductor element of the substrate 100. The first semiconductor layer SEL1 may contain germanium (Ge) whose concentration is relatively low. In some embodiments of the present inventive concepts, the first semiconductor layer SEL1 may include only silicon (Si) and may not include germanium (Ge). The first semiconductor layer SEL1 may contain germanium (Ge) whose concentration ranges from about 0 at % to about 10 at %.

The first semiconductor layer SEL1 may undergo a second selective epitaxial growth (SEG) process to form a second semiconductor layer SEL2. The second semiconductor layer SEL2 may be formed to completely fill the first recess RS1 and the second recess RS2. The second semiconductor layer SEL2 may contain germanium (Ge) whose concentration is relatively high. For example, the second semiconductor layer SEL2 may contain germanium (Ge) whose concentration ranges from about 30 at % to about 55 at %.

The first semiconductor layer SEL1 and the second semiconductor layer SEL2 may constitute the first source/drain pattern SD1. Impurities may be in-situ implanted during the first and second SEG processes. Alternatively, after the first source/drain pattern SD1 is formed, impurities may be doped into the first source/drain pattern SD1. The first source/drain pattern SD1 may be doped to have a first conductivity type (e.g., p-type).

Second source/drain patterns SD2 may be correspondingly formed in the third recesses RS3. For example, the second source/drain pattern SD2 may be formed by performing a third selective epitaxial growth (SEG) process in which an inner wall of the third recess RS3 is used as a seed layer. For example, the second source/drain pattern SD2 may include the same semiconductor element (e.g., Si) as that of the substrate 100. The second source/drain pattern SD2 may be doped to have a second conductivity type (e.g., n-type).

Referring to FIGS. 4 and 14A to 14D, a first interlayer dielectric layer 110 may be formed to cover the first and second source/drain patterns SD1 and SD2, the hardmask patterns MP, and the gate spacers GS. For example, the first interlayer dielectric layer 110 may include a silicon oxide layer.

The first interlayer dielectric layer 110 may be planarized until top surfaces of the sacrificial patterns PP are exposed. An etch-back or chemical mechanical polishing (CMP) process may be employed to planarize the first interlayer dielectric layer 110. The hardmask patterns MP may all be removed during the planarization process. As a result, the first interlayer dielectric layer 110 may have a top surface coplanar with those of the sacrificial patterns PP and those of the gate spacers GS.

A photolithography process may be used to selectively open a partial region of the sacrificial pattern PP. For example, it may be possible to selectively open the partial region of the sacrificial pattern PP on third and fourth boundaries BD3 and BD4 of the first single height cell SHC1. The opened partial region of the sacrificial pattern PP may be selectively etched and removed. A space where the sacrificial pattern PP is removed may be filled with a dielectric material to form a gate cutting pattern CT.

Referring to FIGS. 4 and 15A to 15D, exposed sacrificial patterns PP may be selectively removed. The removal of the sacrificial patterns PP may form outer areas ORG that expose the first and second channel patterns CH1 and CH2 (see FIG. 15D). The removal of the sacrificial patterns PP may include performing a wet etching process using an etchant that selectively etches polysilicon.

Figure 15A:
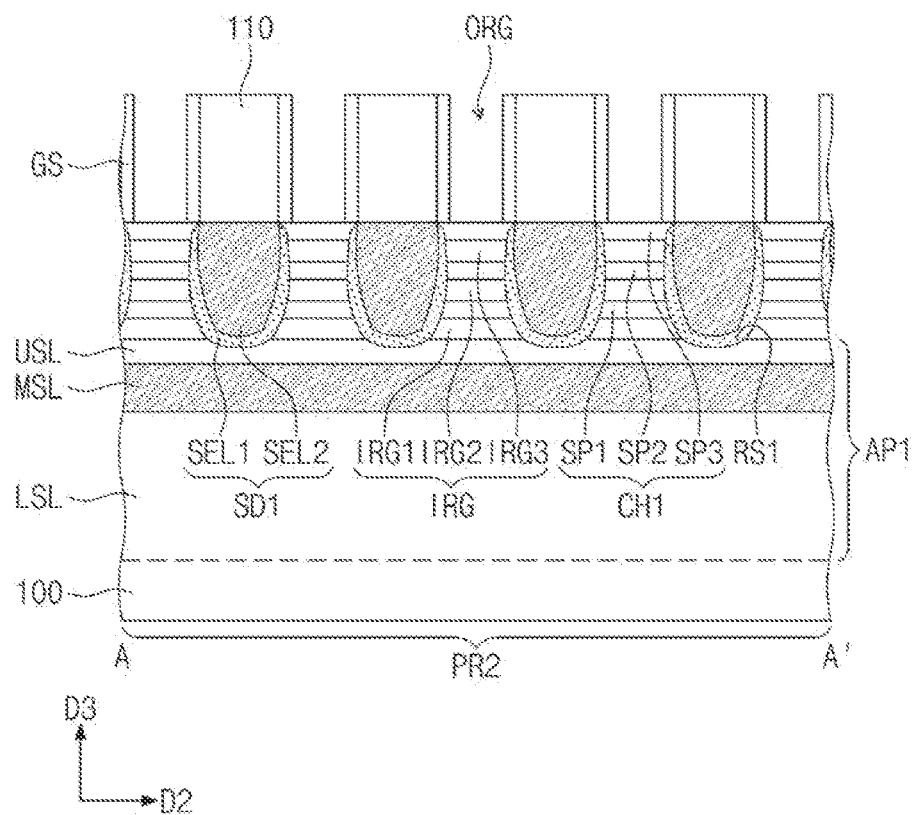
Figure 15B:
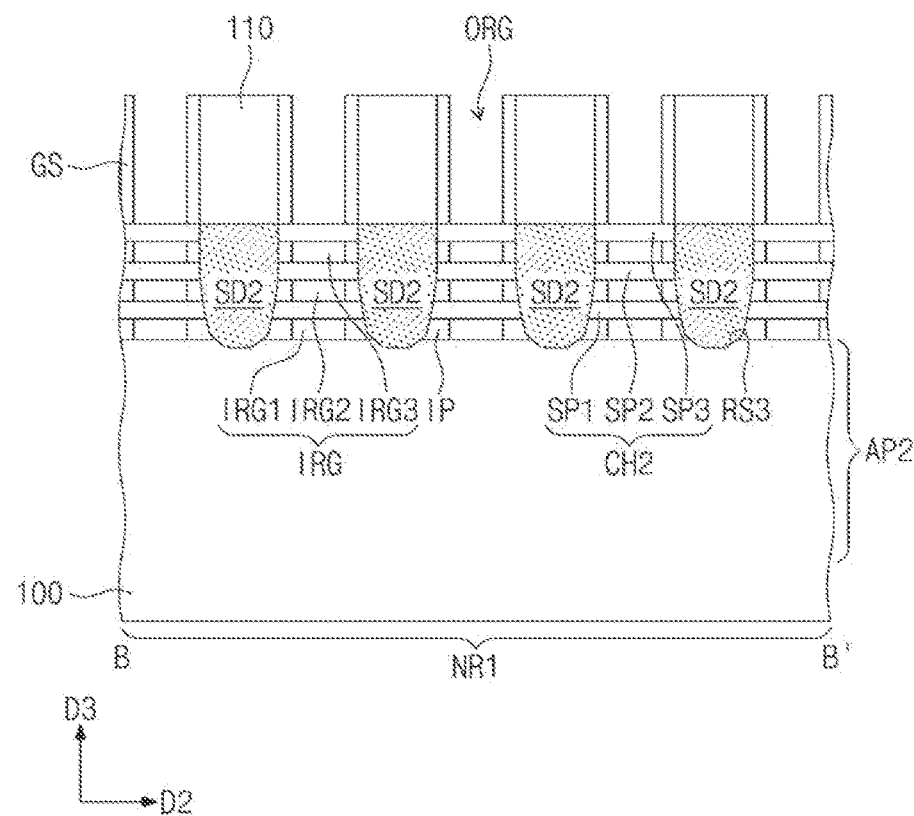
Figure 15C:
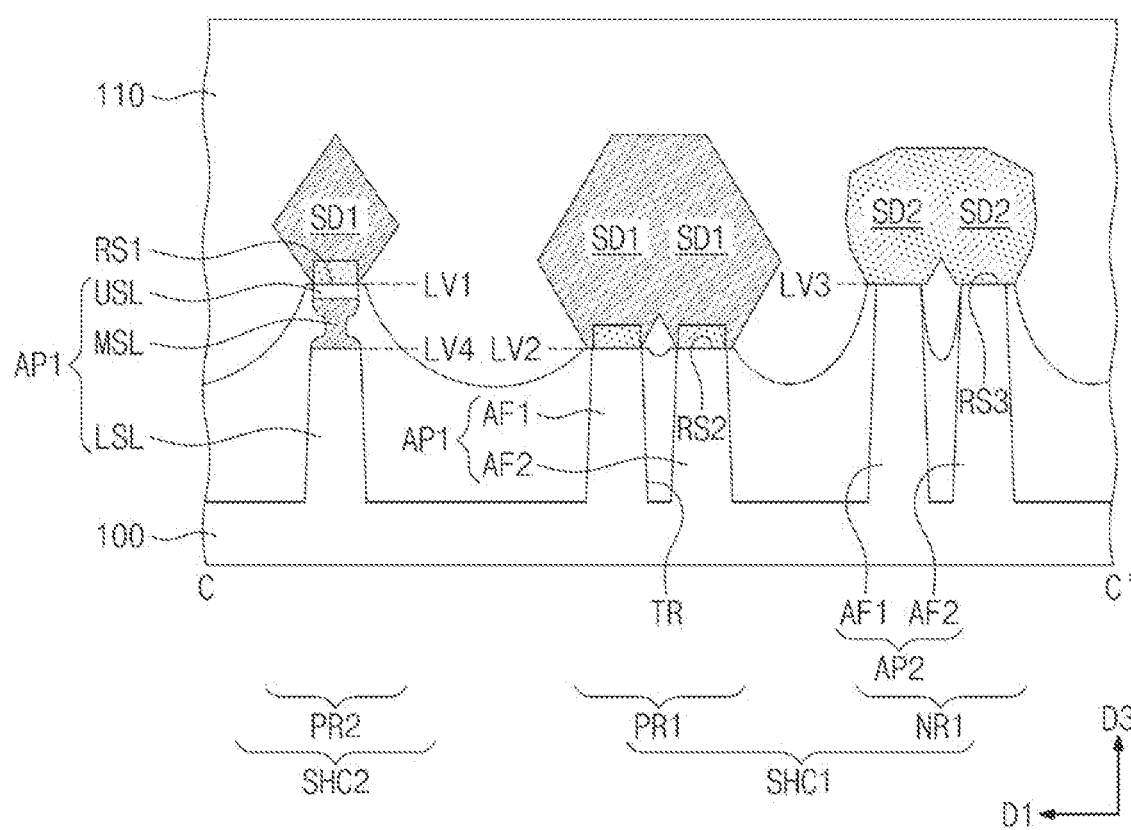
Figure 15D:
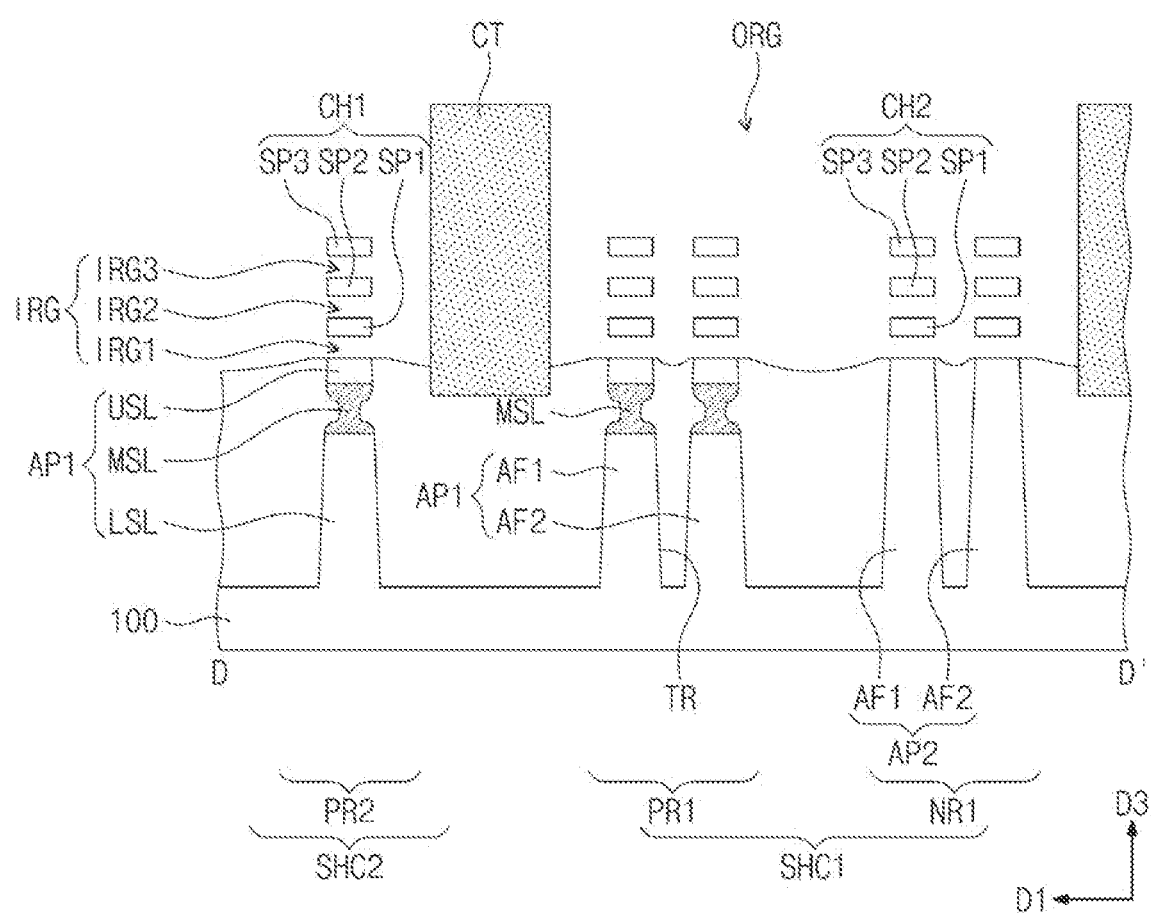
Figure 16A:
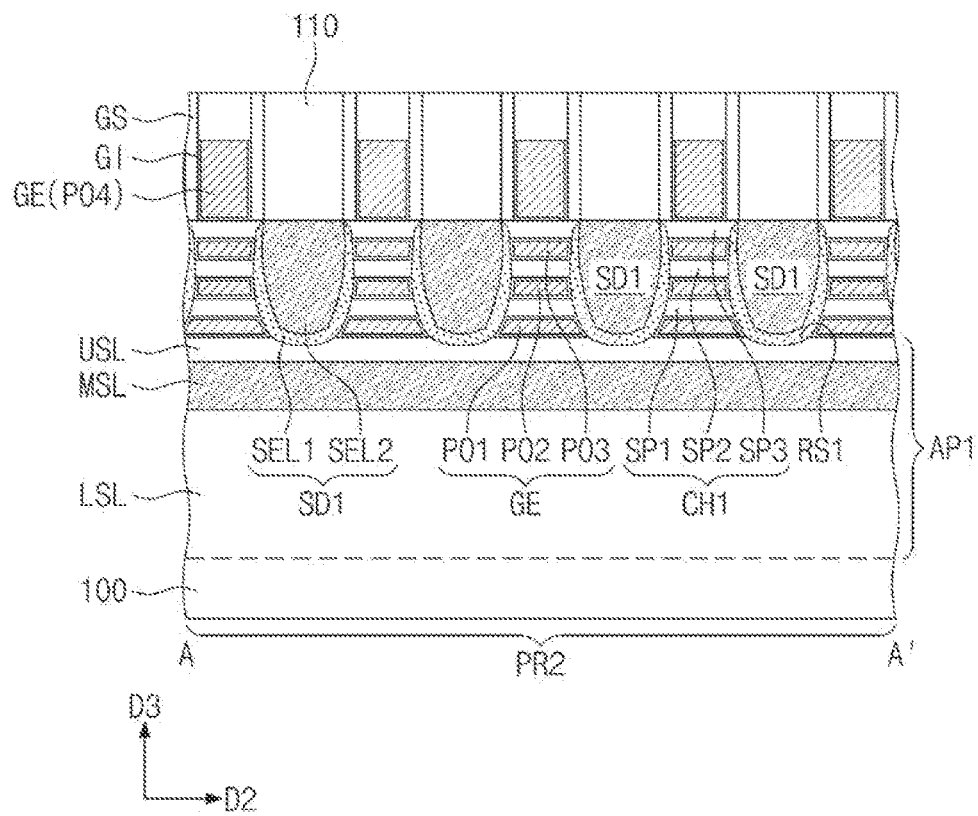
Figure 16B:
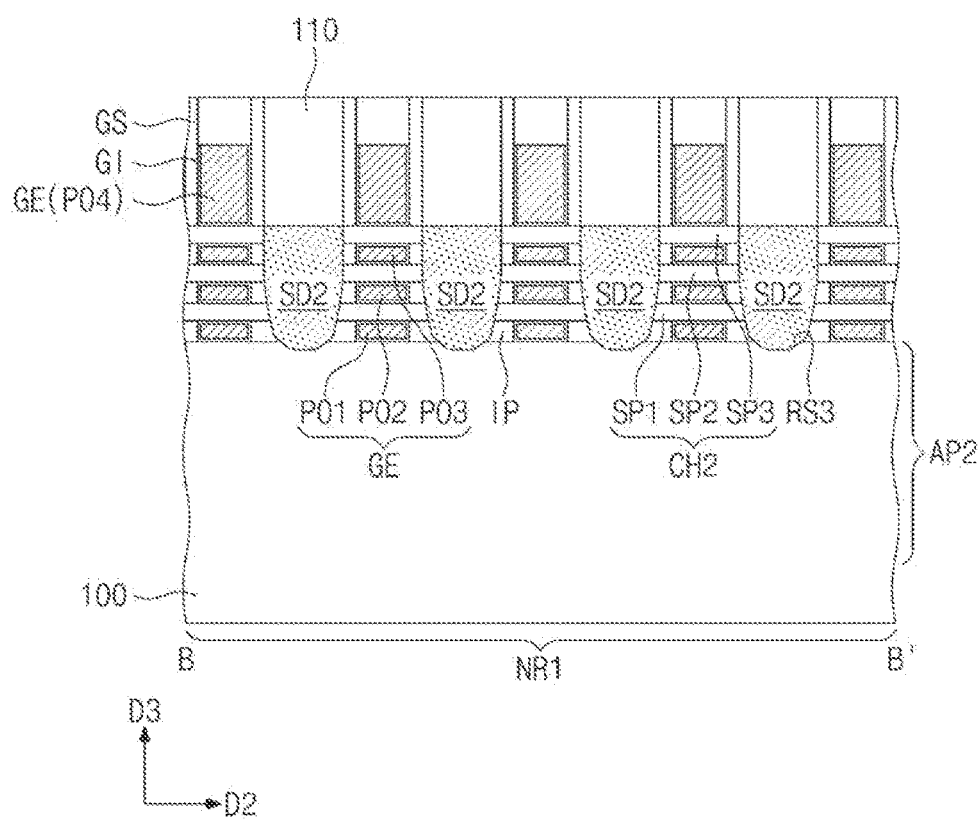
Figure 16C:
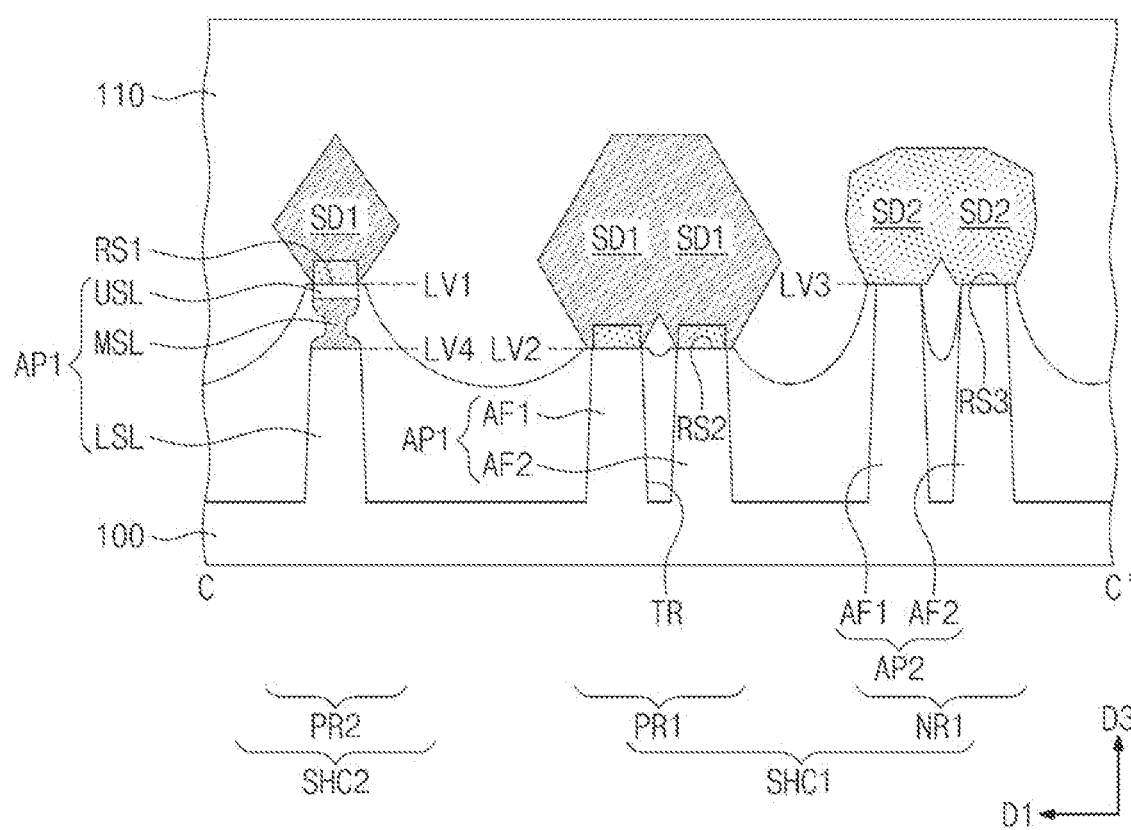
Figure 16D:
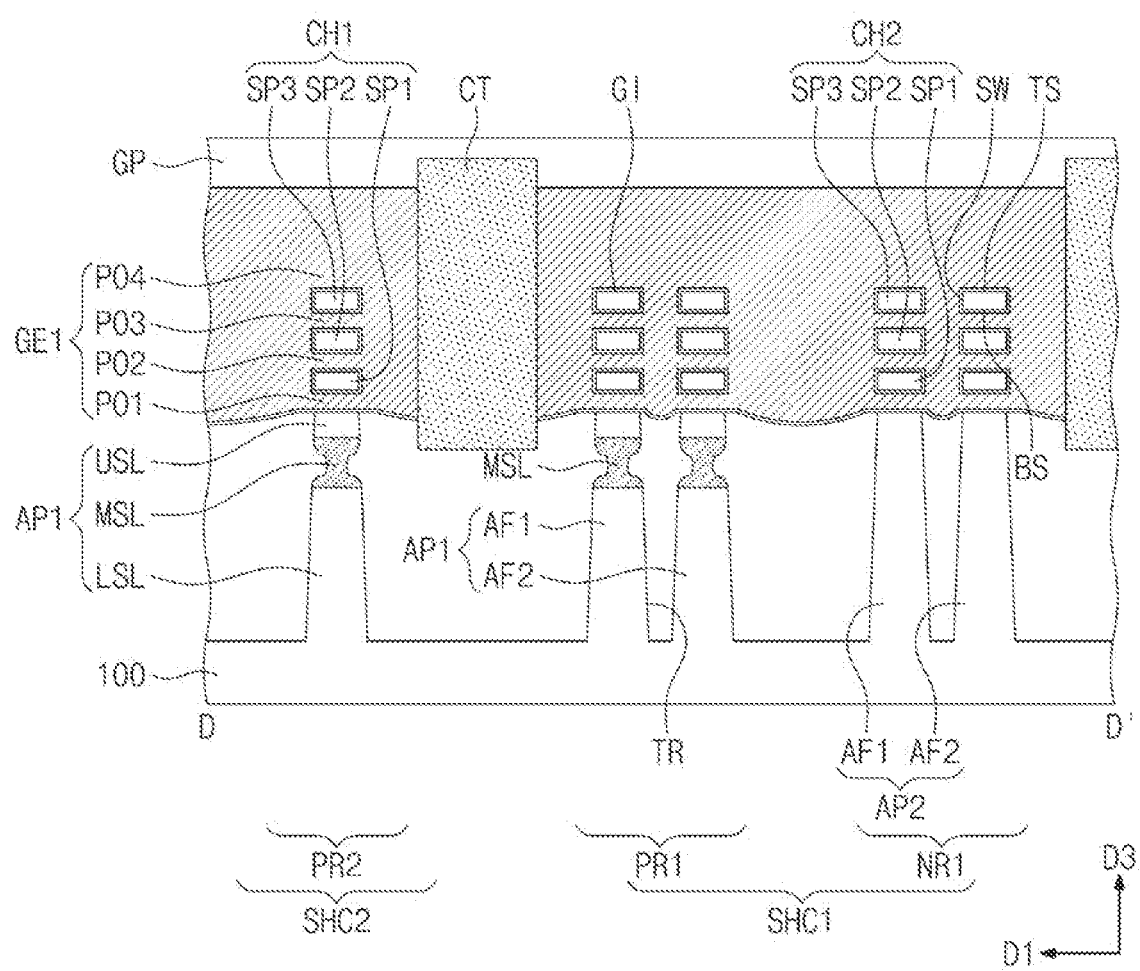

The sacrificial layers SAL exposed to the outer area ORG may be selectively removed to form inner areas IRG (see FIG. 15D). For example, an etching process that selectively etches the sacrificial layers SAL may be performed such that only the sacrificial layers SAL may be removed, and such that the first, second, and third semiconductor patterns SP1, SP2, and SP3 may remain. The etching process may have a large etch rate with respect to silicon-germanium whose germanium concentration is relatively high. For example, the etching process may have a large etch rate with respect to silicon-germanium whose germanium concentration is greater than about 10 at %.

During the etching process, the sacrificial layers SAL may be removed from the first and second PMOSFET regions PR1 and PR2 and from the first and second NMOSFET regions NR1 and NR2. The etching process may be a wet etching process. The etching material used for the etching process may promptly etch the sacrificial layer SAL whose germanium concentration is relatively high. During the etching process, the first source/drain pattern SD1 on the first and second PMOSFET regions PR1 and PR2 may be protected by the first semiconductor layer SELL whose germanium concentration is relatively low.

Referring to FIG. 15D, as the sacrificial layers SAL are selectively removed, only the first, second, and third semiconductor patterns SP1, SP2, and SP3 that are stacked may remain on each of the first and second active patterns AP1 and AP2. The removal of the sacrificial layers SAL may form first, second, and third inner areas IRG1, IRG2, and IRG3.

For example, the first inner area IRG1 may be formed between the first semiconductor pattern SP1 and the active pattern AP1 or AP2, the second inner area IRG2 may be formed between the first semiconductor pattern SP1 and the second semiconductor pattern SP2, and the third inner area IRG3 may be formed between the second semiconductor pattern SP2 and the third semiconductor pattern SP3.

Referring to FIGS. 4 and 16A to 16D, a gate dielectric layer GI may be conformally formed on the first, second, and third semiconductor patterns SP1, SP2, and SP3 that are exposed. A gate electrode GE may be formed on the gate dielectric layer GI. The gate electrode GE may include first, second, and third portions PO1, PO2, and PO3 correspondingly formed in the first, second, and third inner areas IRG1, IRG2, and IRG3, and may also include a fourth portion PO4 formed in the outer area ORG.

The gate electrode GE may be recessed to have a reduced height. While the gate electrode GE is recessed, upper portions of the gate cutting patterns CT may also be slightly recessed. A gate capping pattern GP may be formed on the recessed gate electrode GE.

Referring back to FIGS. 4 and 5A to 5D, a second interlayer dielectric layer 120 may be formed on the first interlayer dielectric layer 110. The second interlayer dielectric layer 120 may include a silicon oxide layer. Active contacts AC may be formed to penetrate the second and first interlayer dielectric layers 120 and 110 and to electrically connect to the first and second source/drain patterns SD1 and SD2. A gate contact GC may be formed to penetrate the second interlayer dielectric layer 120 and the gate capping pattern GP and to electrically connect to the gate electrode GE.

The formation of the active contact AC and the gate contact GC may include forming a barrier pattern BM and forming a conductive pattern FM on the barrier pattern BM. The barrier pattern BM may be conformally formed, and may include a metal layer and a metal nitride layer. The conductive pattern FM may include low-resistance metal.

A pair of separation structures DB may be formed on opposite sides of each of the first and second single height cells SHC1 and SHC2. The separation structure DB may extend from the second interlayer dielectric layer 120 through the gate electrode GE into the active pattern AP1 or AP2. The separation structure DB may include a dielectric material, such as a silicon oxide layer or a silicon nitride layer.

A third interlayer dielectric layer 130 may be formed on the active contacts AC and the gate contacts GC. A first metal layer M1 may be formed in the third interlayer dielectric layer 130. A fourth interlayer dielectric layer 140 may be formed on the third interlayer dielectric layer 130. A second metal layer M2 may be formed in the fourth interlayer dielectric layer 140.

Figure 17:
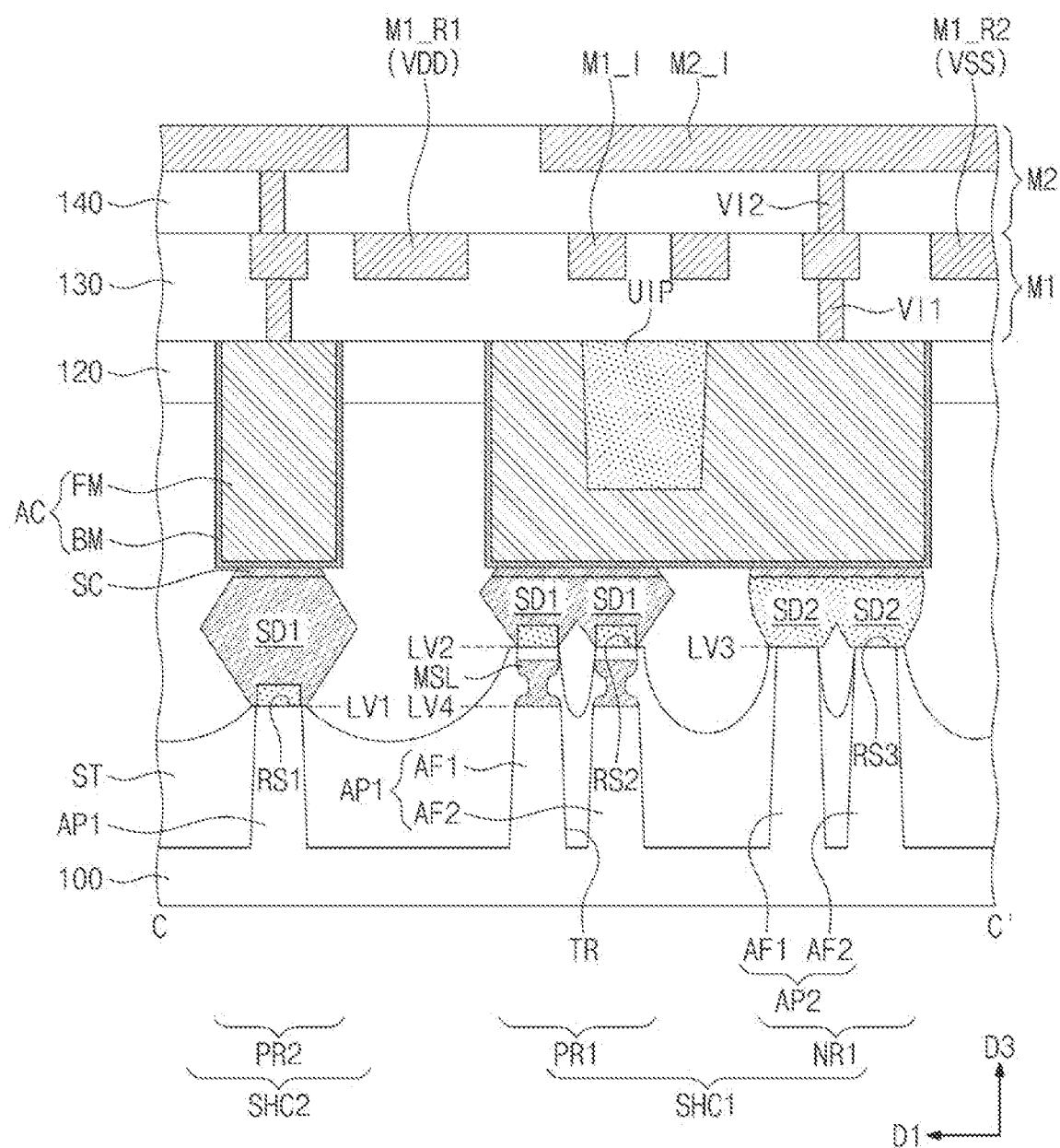
FIG. 17 illustrates a cross-sectional view taken along line C-C' of FIG. 4, according to example embodiments of the present inventive concepts.

FIG. 17 illustrates a cross-sectional view taken along line C-C' of FIG. 4, showing a semiconductor device according to example embodiments of the present inventive concepts. In the embodiment that follows, a description of features repetitive to those discussed above with reference to FIGS. 4, 5A to 5D, and 6 will be omitted, and a difference thereof will be discussed in detail.

Referring to FIGS. 4 and 17, the first source/drain pattern SD1 on the second single height cell SHC2 may have a bottom surface located at a first level LV1. The first source/drain pattern SD1 on the first single height cell SHC1 may have a bottom surface located at a second level LV2. The second level LV2 may be higher than the first level LV1. The second source/drain pattern SD2 may have a bottom surface located at a third level LV3. The third level LV3 may be substantially the same as the second level LV2.

The first source/drain pattern SD1 on the second single height cell SHC2 may be offset from the middle semiconductor layer MSL. On the first single height cell SHC1, a portion of the middle semiconductor layer MSL may vertically overlap the first source/drain pattern SD1. For example, the middle semiconductor layer MSL may be selectively formed based on characteristics of a transistor in a semiconductor device.

Figure 18:
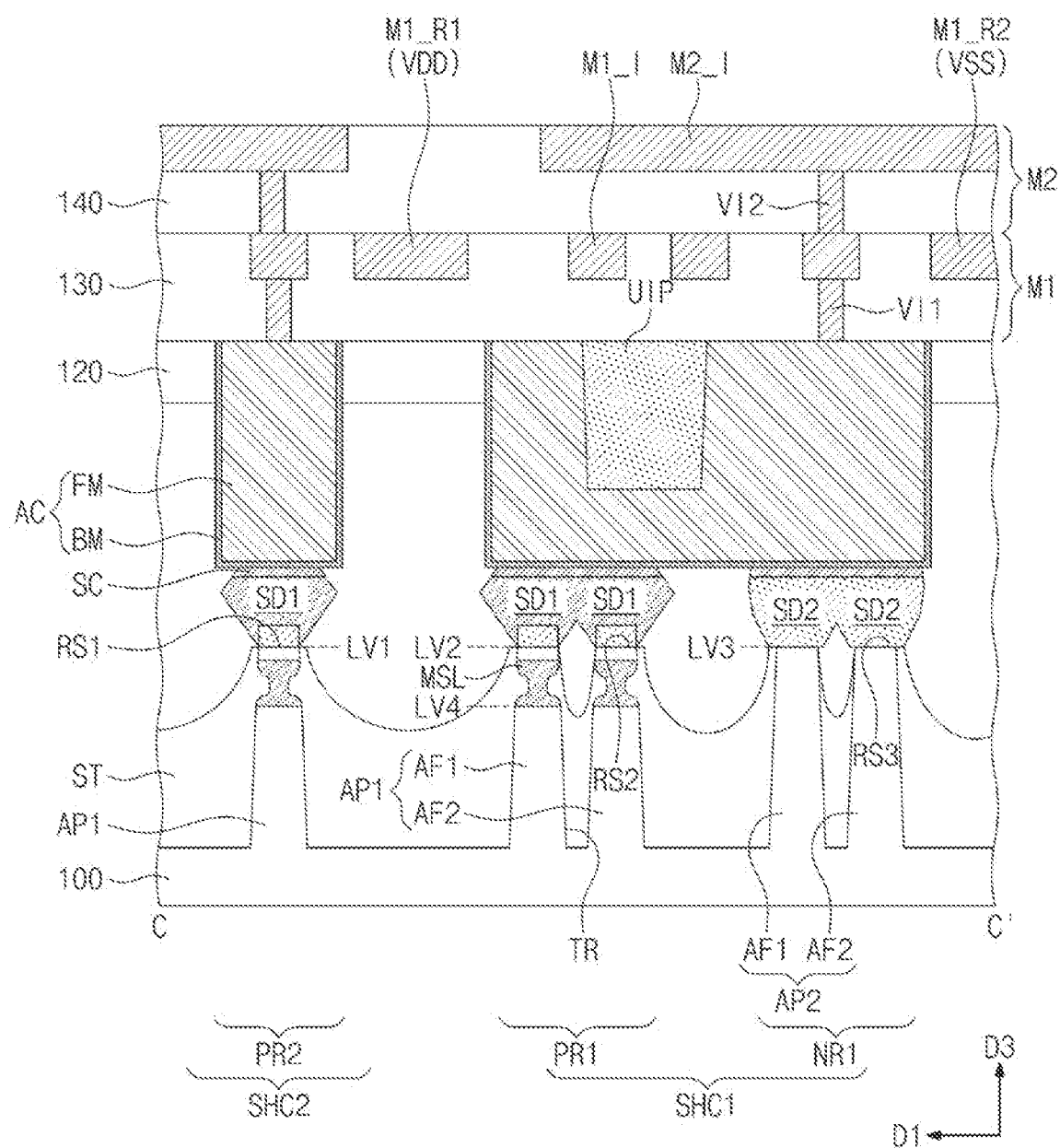
FIG. 18 illustrates a cross-sectional view taken along line C-C' of FIG. 4, according to example embodiments of the present inventive concepts.

FIG. 18 illustrates a cross-sectional view taken along line C-C' of FIG. 4, showing a semiconductor device according to example embodiments of the present inventive concepts. In the embodiment that follows, a description of features repetitive to those discussed above with reference to FIGS. 4, 5A to 5D, and 6 will be omitted, and a difference thereof will be discussed in detail.

Referring to FIGS. 4 and 18, the first source/drain pattern SD1 on the second single height cell SHC2 may have a bottom surface located at a first level LV1. The first source/drain pattern SD1 on the first single height cell SHC1 may have a bottom surface located at a second level LV2. The first and second levels LV1 and LV2 may be substantially the same as each other. The second source/drain pattern SD2 may have a bottom surface located at a third level LV3. The first and third levels LV1 and LV3 may be substantially the same as each other.

On the second single height cell SHC2, a portion of the middle semiconductor layer MSL may vertically overlap the first source/drain pattern SD1. On the first single height cell SHC1, a portion of the middle semiconductor layer MSL may vertically overlap the first source/drain pattern SD1. For example, the middle semiconductor layer MSL may be selectively formed based on characteristics of a transistor in a semiconductor device.

According to some embodiments of the present inventive concepts, a semiconductor layer may be formed which has a bottleneck structure. The bottleneck-structured middle semiconductor layer may cause a first active pattern to have a reduced width, and thus a gate electrode may have an increased capability of channel control. Accordingly, it may be possible to improve a short channel effect occurring due to a reduction in size of a semiconductor device.

In addition, because the middle semiconductor layer undergoes an annealing process to form the bottleneck structure, the middle semiconductor layer may have an increased germanium concentration. Therefore, it may be possible to increase magnitude of compressive stress applied to a first channel pattern. Accordingly, there may be an increase in charge mobility in channel regions of transistors, and in turn the transistor may increase in operating speed. In conclusion, a semiconductor device may increase in electrical properties.

Moreover, according to some embodiments of the present inventive concepts, the bottleneck-structured middle semiconductor layer may be selectively formed based on characteristics of a transistor in a semiconductor device.

Although the present inventive concepts have been described in connection with some embodiments of the present inventive concepts illustrated in the accompanying drawings, it will be understood by one of ordinary skill in the art that variations in form and detail may be made therein without departing from the spirit and essential feature of the present inventive concepts. The above disclosed embodiments should thus be considered illustrative and not restrictive.

What is claimed is:
1. A semiconductor device, comprising:
a substrate that includes a first PMOSFET region and a second PMOSFET region;
a first active pattern and a second active pattern on the first PMOSFET region and the second PMOSFET region, respectively;
a first channel pattern on the first active pattern and a second channel pattern on the second active pattern, each of the first and second channel patterns including a plurality of semiconductor patterns that are vertically stacked and spaced apart from each other; and a first source/drain pattern and a second source/drain pattern connected to the first channel pattern and the second channel pattern, respectively, wherein the first active pattern includes a first lower semiconductor layer, a first middle semiconductor layer, and a first upper semiconductor layer that are sequentially stacked, wherein each of the first lower semiconductor layer and the first upper semiconductor layer includes silicon, wherein the first middle semiconductor layer includes silicon-germanium (SiGe), wherein a width of the first middle semiconductor layer decreases in a downward direction to a minimum value and then increases in the downward direction, and wherein a bottom surface of the first source/drain pattern is at a level higher than a level of a bottom surface of the second source/drain pattern.

2. The semiconductor device of claim 1, wherein a germanium concentration of the first middle semiconductor layer is greater than a germanium concentration of the first source/drain pattern.

3. The semiconductor device of claim 2, wherein the germanium concentration of the first middle semiconductor layer is in a range of about 60 at % to about 65 at %.

4. The semiconductor device of claim 1, wherein a minimum width of the first middle semiconductor layer is about ⅓ to about ½ of a minimum width of the first upper semiconductor layer.

5. The semiconductor device of claim 1, wherein the first middle semiconductor layer includes:
an upper portion adjacent to the first upper semiconductor layer;
a lower portion adjacent to the first lower semiconductor layer; and
a middle portion that connects the upper portion and the lower portion to each other,
wherein a width at a top surface of the upper portion and a width at a bottom surface of the lower portion are greater than a width of the middle portion.

6. The semiconductor device of claim 1, wherein:
the second active pattern includes a first active fin and a second active fin, and
the second source/drain pattern connects the first active fin and the second active fin to each other.

7. The semiconductor device of claim 6, wherein:
each of the first active fin and the second active fin includes a second lower semiconductor layer, a second middle semiconductor layer, and a second upper semiconductor layer,
each of the second lower semiconductor layer and the second upper semiconductor layer includes silicon,
the second middle semiconductor layer includes silicon-germanium (SiGe),
a width of the second middle semiconductor layer decreases in a downward direction to a minimum value and then increases in the downward direction, and
a portion of the second middle semiconductor layer vertically overlaps the second source/drain pattern.

8. The semiconductor device of claim 1, further comprising:
a gate electrode that extends in a horizontal direction and runs across the first and second channel patterns, the gate electrode including portions between the substrate and the plurality of semiconductor patterns;
a gate dielectric layer between the gate electrode and the first and second channel patterns;
a gate spacer on a sidewall of the gate electrode;
a gate capping pattern on a top surface of the gate electrode;
a first interlayer dielectric layer on the gate capping pattern;
a plurality of active contacts that penetrate the first interlayer dielectric layer and are correspondingly coupled to the first and second source/drain patterns;
a gate contact that penetrates the first interlayer dielectric layer and is coupled to the gate electrode;
a second interlayer dielectric layer on the first interlayer dielectric layer;
a first metal layer in the second interlayer dielectric layer;
a third interlayer dielectric layer on the second interlayer dielectric layer; and
a second metal layer in the third interlayer dielectric layer.

9. The semiconductor device of claim 1, further comprising:
an NMOSFET region adjacent to the second PMOSFET region, where the second PMOSFET region is between the NMOSFET region and the first PMOSFET region;
a third active pattern on the NMOSFET region;
a third source/drain pattern on the third active pattern; and
a third channel pattern connected to the third source/drain pattern, the third channel pattern including a first semiconductor pattern, a second semiconductor pattern, and a third semiconductor pattern that are vertically stacked and spaced apart from each other.

10. A semiconductor device, comprising:
a substrate that includes a first PMOSFET region and a second PMOSFET region;
a first active pattern and a second active pattern on the first PMOSFET region and the second PMOSFET region, respectively;
a first channel pattern on the first active pattern and a second channel pattern on the second active pattern, each of the first and second channel patterns including a plurality of semiconductor patterns that are vertically stacked and spaced apart from each other; and
a first source/drain pattern and a second source/drain pattern connected to the first channel pattern and the second channel pattern, respectively,
wherein the first active pattern includes a first lower semiconductor layer, a first middle semiconductor layer, and a first upper semiconductor layer that are sequentially stacked,
wherein each of the first lower semiconductor layer and the first upper semiconductor layer includes silicon,
wherein the first middle semiconductor layer includes silicon-germanium (SiGe), and
wherein a width of the first middle semiconductor layer decreases in a downward direction to a minimum value and then increases in the downward direction,
wherein the first active pattern includes a first active fin and a second active fin,
wherein the first source/drain pattern connects the first active fin and the second active fin to each other, and
wherein a bottom surface of the first source/drain pattern is at a level higher than a level of a bottom surface of the second source/drain pattern.

11. The semiconductor device of claim 10, wherein a germanium concentration of the first middle semiconductor layer is greater than a germanium concentration of the first source/drain pattern.

12. The semiconductor device of claim 10, wherein a minimum width of the first middle semiconductor layer is about ⅓ to about ½ of a minimum width of the first upper semiconductor layer.

13. The semiconductor device of claim 10, wherein the first middle semiconductor layer includes:
- an upper portion adjacent to the first upper semiconductor layer;
- a lower portion adjacent to the first lower semiconductor layer; and
- a middle portion that connects the upper portion and the lower portion to each other,
- wherein a width at a top surface of the upper portion and a width at a bottom surface of the lower portion are greater than a width of the middle portion.

14. The semiconductor device of claim 10, further comprising:
- a gate electrode that extends in a horizontal direction and runs across the first and second channel patterns, the gate electrode including portions between the substrate and the plurality of semiconductor patterns;
- a gate dielectric layer between the gate electrode and the first and second channel patterns;
- a gate spacer on a sidewall of the gate electrode;
- a gate capping pattern on a top surface of the gate electrode;
- a first interlayer dielectric layer on the gate capping pattern;
- a plurality of active contacts that penetrate the first interlayer dielectric layer and are correspondingly coupled to the first and second source/drain patterns;
- a gate contact that penetrates the first interlayer dielectric layer and is coupled to the gate electrode;
- a second interlayer dielectric layer on the first interlayer dielectric layer;
- a first metal layer in the second interlayer dielectric layer;
- a third interlayer dielectric layer on the second interlayer dielectric layer; and
- a second metal layer in the third interlayer dielectric layer.

15. A semiconductor device, comprising:
- a substrate that includes a first PMOSFET region and a second PMOSFET region;
- a first active pattern and a second active pattern on the first PMOSFET region and the second PMOSFET region, respectively;
- a first channel pattern on the first active pattern and a second channel pattern on the second active pattern, each of the first and second channel patterns including a plurality of semiconductor patterns that are vertically stacked and spaced apart from each other; and
- a first source/drain pattern and a second source/drain pattern connected to the first channel pattern and the second channel pattern, respectively,
- wherein the first active pattern includes a first lower semiconductor layer, a first middle semiconductor layer, and a first upper semiconductor layer that are sequentially stacked,
- wherein each of the first lower semiconductor layer and the first upper semiconductor layer includes silicon,
- wherein the first middle semiconductor layer includes silicon-germanium (SiGe),
- wherein a width of the first middle semiconductor layer decreases in a downward direction to a minimum value and then increases in the downward direction, and
- wherein a bottom surface of the first middle semiconductor layer is at a level higher than a level of a bottom surface of the second source/drain pattern.

16. The semiconductor device of claim 15, wherein a germanium concentration of the first middle semiconductor layer is greater than a germanium concentration of the first source/drain pattern.

17. The semiconductor device of claim 15, wherein a minimum width of the first middle semiconductor layer is about ⅓ to about ½ of a minimum width of the first upper semiconductor layer.

18. The semiconductor device of claim 15, wherein the first middle semiconductor layer includes:
- an upper portion adjacent to the first upper semiconductor layer;
- a lower portion adjacent to the first lower semiconductor layer; and
- a middle portion that connects the upper portion and the lower portion to each other,
- wherein a width at a top surface of the upper portion and a width at a bottom surface of the lower portion are greater than a width of the middle portion.

19. The semiconductor device of claim 15, further comprising:
- a gate electrode that extends in a horizontal direction and runs across the first and second channel patterns, the gate electrode including portions between the substrate and the plurality of semiconductor patterns;
- a gate dielectric layer between the gate electrode and the first and second channel patterns;
- a gate spacer on a sidewall of the gate electrode;
- a gate capping pattern on a top surface of the gate electrode;
- a first interlayer dielectric layer on the gate capping pattern;
- a plurality of active contacts that penetrate the first interlayer dielectric layer and are correspondingly coupled to the first and second source/drain patterns;
- a gate contact that penetrates the first interlayer dielectric layer and is coupled to the gate electrode;
- a second interlayer dielectric layer on the first interlayer dielectric layer;
- a first metal layer in the second interlayer dielectric layer;
- a third interlayer dielectric layer on the second interlayer dielectric layer; and
- a second metal layer in the third interlayer dielectric layer.

20. The semiconductor device of claim 15, wherein a germanium concentration of the first middle semiconductor layer is in a range of about 60 at % to about 65 at %.

* * * * *